(12) United States Patent
Peralta et al.

(10) Patent No.: US 10,424,969 B2
(45) Date of Patent: *Sep. 24, 2019

(54) SUBSTRATE CONFIGURED TO FACILITATE THROUGH-METAL ENERGY TRANSFER VIA NEAR FIELD MAGNETIC COUPLING

(71) Applicant: NUCURRENT, INC., Chicago, IL (US)

(72) Inventors: Alberto Peralta, Chicago, IL (US); Md. Nazmul Alam, Lombard, IL (US); Vinit Singh, Austin, TX (US); Sina Haji Alizad, Chicago, IL (US)

(73) Assignee: NuCurrent, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/836,228

(22) Filed: Dec. 8, 2017

(65) Prior Publication Data

US 2018/0168057 A1    Jun. 14, 2018

Related U.S. Application Data

(60) Provisional application No. 62/432,320, filed on Dec. 9, 2016.

(51) Int. Cl.
*H01Q 7/00* (2006.01)
*H02J 50/12* (2016.01)
(Continued)

(52) U.S. Cl.
CPC ............ *H02J 50/12* (2016.02); *H01F 27/362* (2013.01); *H01F 38/14* (2013.01); *H01Q 1/2266* (2013.01);
(Continued)

(58) Field of Classification Search
CPC .. H02J 50/12; H02J 50/70; H02J 5/005; H02J 7/025; H01F 38/14; H01F 27/362;
(Continued)

(56) References Cited

U.S. PATENT DOCUMENTS 2,797,393 A    6/1957  Clogston
2,911,605 A   11/1959  Wales, Jr.
(Continued)

FOREIGN PATENT DOCUMENTS

CN    2650300 Y    10/2004
CN  104037493 A    9/2014
(Continued)

OTHER PUBLICATIONS

EP Search Report 10751119.8.
(Continued)

*Primary Examiner* — Jean B Jeanglaude
(74) *Attorney, Agent, or Firm* — McDermott Will & Emery LLP

(57) ABSTRACT

An electrically conductive material configured having at least one opening of various unlimited geometries extending through its thickness is provided. The opening is designed to modify eddy currents that form within the surface of the material from interaction with magnetic fields that allow for wireless energy transfer therethrough. The opening may be configured as a cut-out, a slit or combination thereof that extends through the thickness of the electrically conductive material. The electrically conductive material is configured with the cut-out and/or slit pattern positioned adjacent to an antenna configured to receive or transmit electrical energy wirelessly through near-field magnetic coupling (NFMC). A magnetic field shielding material, such as a ferrite, may also be positioned adjacent to the antenna. Such magnetic shielding materials may be used to strategically block eddy currents from electrical components and circuitry located within a device.

18 Claims, 20 Drawing Sheets

(51) Int. Cl.

| | | |
|---|---|---|
| *H02J 50/70* | (2016.01) | |
| *H01Q 1/22* | (2006.01) | |
| *H01Q 1/38* | (2006.01) | |
| *H04B 5/00* | (2006.01) | |
| *H01Q 1/24* | (2006.01) | |
| *H05K 5/02* | (2006.01) | |
| *H05K 9/00* | (2006.01) | |
| *H01Q 1/36* | (2006.01) | |
| *H01F 27/36* | (2006.01) | |
| *H01F 38/14* | (2006.01) | |
| *H02J 7/02* | (2016.01) | |
| *H01F 27/34* | (2006.01) | |
| *H02J 5/00* | (2016.01) | |

(52) U.S. Cl.
CPC .............. *H01Q 1/24* (2013.01); *H01Q 1/36* (2013.01); *H01Q 1/38* (2013.01); *H01Q 7/00* (2013.01); *H01Q 7/005* (2013.01); *H02J 50/70* (2016.02); *H04B 5/0031* (2013.01); *H04B 5/0037* (2013.01); *H04B 5/0081* (2013.01); *H04B 5/0093* (2013.01); *H05K 5/0247* (2013.01); *H05K 9/0084* (2013.01); *H01F 2027/348* (2013.01); *H01Q 1/248* (2013.01); *H02J 5/005* (2013.01); *H02J 7/025* (2013.01)

(58) Field of Classification Search
CPC ............ H01F 2027/348; H04B 5/0093; H04B 5/0037; H04B 5/0081; H04B 5/0031; H01Q 7/00; H01Q 1/2266; H01Q 1/38; H01Q 7/005; H01Q 1/36; H01Q 1/24; H01Q 1/248; H05K 9/0084; H05K 5/0247
USPC ......................................................... 343/866
See application file for complete search history.

(56) References Cited

U.S. PATENT DOCUMENTS

| | | | |
|---|---|---|---|
| 3,484,731 A | 12/1969 | Rich | |
| 4,328,531 A | 5/1982 | Shinagawa | |
| 4,494,100 A | 1/1985 | Nejdl | |
| 4,959,631 A | 9/1990 | Sahashi | |
| 4,996,165 A | 2/1991 | Asbeck | |
| 5,137,478 A | 8/1992 | Graf | |
| 5,237,165 A | 8/1993 | Tingley, III | |
| 5,604,352 A | 2/1997 | Schuetz | |
| 5,713,939 A | 2/1998 | Nedungadi | |
| 5,748,464 A | 5/1998 | Schuetz | |
| 5,767,808 A | 6/1998 | Skogland | |
| 5,767,813 A | 6/1998 | Yao | |
| 5,777,538 A | 7/1998 | Schuetz | |
| 5,801,611 A | 9/1998 | Waanders | |
| 5,838,154 A | 11/1998 | Nishibe | |
| 5,883,392 A | 3/1999 | Schuetz | |
| 5,892,489 A | 4/1999 | Mandai | |
| 5,980,773 A | 11/1999 | Takeda | |
| 6,005,193 A | 12/1999 | Markel | |
| 6,021,337 A | 2/2000 | Hodge | |
| 6,028,568 A | 2/2000 | Mandai | |
| 6,107,972 A | 8/2000 | Seward | |
| 6,148,221 A | 11/2000 | Hidaka | |
| 6,163,307 A | 12/2000 | Park | |
| 6,271,803 B1 | 8/2001 | Kanba | |
| 6,503,831 B2 | 1/2003 | Speakman | |
| 6,556,101 B1 | 4/2003 | Tada | |
| 6,583,769 B2 | 6/2003 | Asakura | |
| 6,664,863 B1 | 12/2003 | Ikeda | |
| 6,809,688 B2 | 10/2004 | Yamada | |
| 6,924,230 B2 | 8/2005 | Sheu | |
| 7,046,113 B1 | 5/2006 | Ikeda | |
| 7,205,655 B2 | 4/2007 | Sippola | |
| 7,355,558 B2 | 4/2008 | Lee | |
| 7,563,352 B2 | 7/2009 | Hubel | |
| 7,579,835 B2 | 8/2009 | Schnell | |
| 7,579,836 B2 | 8/2009 | Schnell | |
| 7,713,762 B2 | 5/2010 | Lee | |
| 7,786,836 B2 | 8/2010 | Gabara | |
| 7,952,365 B2 | 5/2011 | Kushta | |
| 8,056,819 B2 | 11/2011 | Rowell | |
| 8,299,877 B2 | 10/2012 | Hong | |
| 8,436,780 B2 | 5/2013 | Compston | |
| 8,567,048 B2 | 10/2013 | Babcock | |
| 8,610,530 B2 | 12/2013 | Singh | |
| 8,653,927 B2 | 2/2014 | Singh | |
| 8,680,960 B2 | 3/2014 | Singh | |
| 8,692,641 B2 | 4/2014 | Singh | |
| 8,692,642 B2 | 4/2014 | Singh | |
| 8,698,590 B2 | 4/2014 | Singh | |
| 8,698,591 B2 | 4/2014 | Singh | |
| 8,707,546 B2 | 4/2014 | Singh | |
| 8,710,948 B2 | 4/2014 | Singh | |
| 8,774,712 B2 | 7/2014 | Sato | |
| 8,803,649 B2 | 8/2014 | Singh | |
| 8,823,481 B2 | 9/2014 | Singh | |
| 8,823,482 B2 | 9/2014 | Singh | |
| 8,855,786 B2 | 10/2014 | Derbas | |
| 8,860,545 B2 | 10/2014 | Singh | |
| 8,898,885 B2 | 12/2014 | Babcock | |
| 9,208,942 B2 | 12/2015 | Frysz | |
| 2002/0020554 A1 | 2/2002 | Sakamoto | |
| 2002/0053992 A1 | 5/2002 | Kawakami | |
| 2002/0101383 A1 | 8/2002 | Junod | |
| 2002/0105080 A1 | 8/2002 | Speakman | |
| 2003/0006069 A1 | 1/2003 | Watanabe | |
| 2003/0058180 A1* | 3/2003 | Forster | B65D 25/205 |
| | | | 343/767 |
| 2003/0119677 A1 | 6/2003 | Gao | |
| 2004/0000974 A1 | 1/2004 | Odenaal | |
| 2004/0085247 A1 | 5/2004 | Capelli | |
| 2004/0108311 A1 | 6/2004 | De Rooij | |
| 2004/0140528 A1 | 7/2004 | Kim | |
| 2004/0159460 A1 | 8/2004 | Passiopoulos | |
| 2004/0189528 A1 | 9/2004 | Delgado | |
| 2004/0217488 A1 | 11/2004 | Luechinger | |
| 2005/0121229 A1 | 6/2005 | Sueyoshi | |
| 2005/0174628 A1 | 8/2005 | Zhang | |
| 2006/0022772 A1 | 2/2006 | Kanno | |
| 2006/0040628 A1 | 2/2006 | Porret | |
| 2006/0192645 A1 | 8/2006 | Lee | |
| 2006/0284718 A1 | 12/2006 | Benetik | |
| 2007/0018767 A1 | 1/2007 | Gabara | |
| 2007/0023424 A1 | 2/2007 | Weber | |
| 2007/0045773 A1 | 3/2007 | Mizuno | |
| 2007/0046544 A1 | 3/2007 | Sano | |
| 2007/0095913 A1 | 5/2007 | Takahashi | |
| 2007/0120629 A1 | 5/2007 | Schnell | |
| 2007/0179570 A1 | 8/2007 | De Taboada | |
| 2008/0039332 A1 | 2/2008 | Touitou | |
| 2008/0062066 A1 | 3/2008 | Arai | |
| 2008/0067874 A1 | 3/2008 | Tseng | |
| 2008/0164960 A1 | 7/2008 | Schnell | |
| 2008/0211320 A1 | 9/2008 | Secall | |
| 2008/0283277 A1 | 11/2008 | Kusama | |
| 2009/0015266 A1 | 1/2009 | Narita | |
| 2009/0079268 A1 | 3/2009 | Cook | |
| 2009/0085706 A1 | 4/2009 | Duckworth | |
| 2009/0108974 A1 | 4/2009 | Raggam | |
| 2009/0134875 A1 | 5/2009 | Tomiha | |
| 2009/0152542 A1 | 6/2009 | Leung | |
| 2009/0261936 A1 | 10/2009 | Sarangan | |
| 2010/0033290 A1 | 2/2010 | Frye | |
| 2010/0072588 A1 | 3/2010 | Yang | |
| 2010/0127660 A1 | 5/2010 | Widmer | |
| 2010/0141042 A1 | 6/2010 | Giler | |
| 2010/0164296 A1 | 7/2010 | Soljacic | |
| 2010/0289599 A1 | 11/2010 | Vangala | |
| 2010/0289709 A1 | 11/2010 | Guan | |
| 2010/0295701 A1 | 11/2010 | Cazenave | |
| 2011/0024510 A1 | 2/2011 | Ishino | |

(56) References Cited

U.S. PATENT DOCUMENTS

| | | |
|---|---|---|
| 2011/0241437 A1 | 10/2011 | Kanno |
| 2011/0248891 A1 | 10/2011 | Park |
| 2011/0279198 A1 | 11/2011 | Haner |
| 2012/0062345 A1 | 3/2012 | Kurs |
| 2012/0095531 A1 | 4/2012 | Derbas |
| 2012/0169434 A1 | 7/2012 | Mori |
| 2012/0235500 A1 | 9/2012 | Schatz |
| 2012/0235634 A1 | 9/2012 | Kulikowski |
| 2012/0249396 A1 | 10/2012 | Parsche |
| 2012/0280765 A1 | 11/2012 | Soljacic |
| 2012/0326931 A1 | 12/2012 | Kato |
| 2013/0067737 A1 | 3/2013 | Singh |
| 2013/0067738 A1 | 3/2013 | Singh |
| 2013/0068499 A1 | 3/2013 | Singh |
| 2013/0068507 A1 | 3/2013 | Singh |
| 2013/0069748 A1 | 3/2013 | Frysz |
| 2013/0069749 A1 | 3/2013 | Singh |
| 2013/0069750 A1 | 3/2013 | Singh |
| 2013/0069843 A1 | 3/2013 | Frysz |
| 2013/0076154 A1 | 3/2013 | Baarman |
| 2013/0146671 A1 | 6/2013 | Woerle |
| 2013/0199027 A1 | 8/2013 | Singh |
| 2013/0199028 A1 | 8/2013 | Singh |
| 2013/0200070 A1 | 8/2013 | Singh |
| 2013/0200722 A1 | 8/2013 | Singh |
| 2013/0200968 A1 | 8/2013 | Singh |
| 2013/0200969 A1 | 8/2013 | Singh |
| 2013/0200976 A1 | 8/2013 | Singh |
| 2013/0201589 A1 | 8/2013 | Singh |
| 2013/0205582 A1 | 8/2013 | Singh |
| 2013/0207744 A1 | 8/2013 | Singh |
| 2013/0208389 A1 | 8/2013 | Singh |
| 2013/0208390 A1 | 8/2013 | Singh |
| 2013/0257362 A1 | 10/2013 | Lim |
| 2013/0300207 A1 | 11/2013 | Wang |
| 2014/0028111 A1 | 1/2014 | Hansen |
| 2014/0035793 A1* | 2/2014 | Kato ............ H01Q 1/243 343/867 |
| 2014/0041218 A1 | 2/2014 | Signh |
| 2014/0047713 A1 | 2/2014 | Derbas |
| 2014/0084946 A1 | 3/2014 | Gadot |
| 2014/0168019 A1 | 6/2014 | Uejima |
| 2014/0183971 A1 | 7/2014 | Endo |
| 2014/0231518 A1 | 8/2014 | Yosui |
| 2014/0266019 A1 | 9/2014 | Pigott |
| 2014/0361628 A1 | 12/2014 | Keeling |
| 2015/0054455 A1 | 2/2015 | Kim |
| 2015/0140807 A1 | 5/2015 | Mohammed |
| 2015/0145635 A1 | 5/2015 | Duetsch |
| 2015/0180440 A1 | 6/2015 | Ishizuka |
| 2015/0207541 A1 | 7/2015 | Kuroda |
| 2015/0236545 A1 | 8/2015 | Hyun |
| 2015/0269474 A1* | 9/2015 | Finn ............ G06K 19/07718 235/492 |
| 2015/0280322 A1 | 10/2015 | Saito |
| 2016/0056664 A1 | 2/2016 | Partovi |
| 2016/0118711 A1 | 4/2016 | Ummenhofer |
| 2016/0126002 A1 | 5/2016 | Chen |
| 2016/0156103 A1 | 6/2016 | Hyun |
| 2016/0224975 A1 | 8/2016 | Na |
| 2016/0292669 A1* | 10/2016 | Tunnell ............ G06Q 20/3278 |
| 2018/0212649 A1* | 7/2018 | Tenno ............ H01Q 7/00 |

FOREIGN PATENT DOCUMENTS

| | | |
|---|---|---|
| CN | 104037494 A | 9/2014 |
| EP | 0310396 A1 | 4/1989 |
| EP | 1609503 A1 | 12/2005 |
| EP | 2031729 A2 | 3/2009 |
| JP | 09-093005 A | 4/1997 |
| JP | 2007-7042569 A | 2/2007 |
| JP | 2014-175864 A | 9/2014 |
| JP | 2014-175865 A | 9/2014 |
| KR | 10-2014-0111554 A | 9/2014 |
| KR | 10-2014-0111794 A | 9/2014 |
| KR | 2014-0135357 A | 11/2014 |
| TW | 201436494 A | 9/2014 |
| TW | 201436495 A | 9/2014 |
| WO | 2010/104569 A1 | 9/2010 |

OTHER PUBLICATIONS

EP Search Report 13001121.6.
EP Search Report 13001130.7.
EP Search Report 14000885.5.
Relative Permativity—Dielectric Constant—Jul. 2011 (3 pages).
Office Action dated Sep. 27, 2016 in corresponding EP Application No. 13 001 130.7 (6 pages).
Office Action dated Sep. 27, 2016 in corresponding EP Application No. 13 001 121.6 (6 pages).
Office Action dated Jan. 31, 2017 in corresponding JP Application No. 2013-047049 (5 pages).
Office Action dated Jun. 29, 2017 in corresponding EP Application No. 14000885.5 (4 pages).
Office Action dated Feb. 21, 2017 in corresponding TW Application No. 102108342 (10 pages).
Office Action dated Mar. 21, 2017 in corresponding JP Application No. 2013-047048 (12 pages).
International Search Report and Written Opinion dated Oct. 14, 2016 for PCT/US2016/045588 (10 pages).
International Search Report and Written Opinion dated Oct. 28, 2016 for PCT/US2016/047607 (9 pages).
International Search Report and Written Opinion dated issued in PCT/US2017/048708 dated Nov. 8, 2017 (10 pages).
EP Communication pursuant to Rule 62 EPC regarding extended European Search Report for EP App. No. 16835665.7-1212 dated May 15, 2019, 16 pages.
Notification of Decision of Rejection for KR App. No. 10-2013-0025858 dated May 14, 2019, English Translation, 4 pages.
Notification of Decision of Rejection for KR 10-2013-0026135 dated May 14, 2019, 8 pages with translation.
EP Communication of extended European Search Report for EP 19154162.2 dated Jun. 12, 2019, 9 pages.

* cited by examiner

SUBSTRATE CONFIGURED TO FACILITATE THROUGH-METAL ENERGY TRANSFER VIA NEAR FIELD MAGNETIC COUPLING

RELATED APPLICATION

This application claims priority to U.S. Provisional Application No. 62/432,320, filed on Dec. 9, 2016, the disclosure of which is entirely incorporated herein by reference.

TECHNICAL FIELD

The present disclosure generally relates to the wireless transmission of electrical energy and data. More specifically, this application relates to various embodiments which enable the transmission of wireless electrical energy by near-field magnetic coupling through an electrically conductive material.

BACKGROUND

Near field magnetic coupling (NFMC) is a commonly employed technique to wirelessly transfer electrical energy. The electrical energy may be used to directly power a device, charge a battery or both.

In near field magnetic coupling (NFMC) an oscillating magnetic field generated by a transmitting antenna passes through a receiving antenna that is spaced from the transmitting antenna, thereby creating an alternating electrical current that is received by the receiving antenna.

However, when a magnetic field interacts with an electrically conductive material, such as a metal, a circulating eddy current is induced on the surface of the conductive material as described by Faraday's Law. The eddy current generated on the surface of the conductive material generates a secondary magnetic field which opposes an incident magnetic field generated by the transmitting antenna. The interaction between the incident magnetic field generated by the transmitting antenna and the opposing secondary magnetic field, generated by the eddy current induced in the metallic material, prevents the transmission of electrical energy from the transmitting antenna to the receiving antenna. Thus, the inclusion of a metallic substrate or backing with electronic devices that incorporate near field magnetic coupling wireless charging is prohibited. The interaction of the incident magnetic field with a metallic material comprising an exterior surface of a device prevents near-field wireless electrical energy transmission with the device.

In addition, the circulating eddy current causes undesirable heating of the conductive material. Such heating may result in the loss of wireless energy but also could result in damage to the electrical components within the device due to the increased heat. Currently, materials in which NFMC wireless energy can transmit through are limited to non-conductive materials, such as glass, that do not deleteriously affect the incident magnetic flux lines from a transmitting antenna. Incorporation of an electrically conductive material, such as a metal, within at least a portion of an exterior surface of a device, may be required. Electrically conductive materials provide structural support to such electronic devices as cellular phones, wearable devices, and medical devices, all of which could benefit from wireless transfer of electrical energy through NFMC. Thus, there is a need for NFMC wireless energy transfer through a metallic material.

SUMMARY

The present disclosure relates to the transfer of wireless electrical energy to and from devices that incorporate electrically conductive material, such as a metal. Such devices may include, but are not limited to, consumer electronics, medical devices, and devices used in industrial and military applications.

In one or more embodiments, an electrically conductive material, such as a metal substrate or plate is provided that is configured having at least one opening that extends through its thickness. In one or more embodiments, the electrically conductive material comprises at least a portion of an exterior surface of an electronic device. For example, the electrically conductive material may comprise a device cover, a casing, a backing, or a device enclosure. In some embodiments, an electrically conductive material is provided having a specific pattern of openings that extend through the thickness. Such a pattern of openings that extend through the conductive material is designed to modify the magnitude and path of the induced eddy current on the surface of the electrically conductive material to allow for wireless energy transfer via NFMC through the electrically conductive material.

In one or more embodiments, an opening, cut-out, slit, or combination thereof is formed through the thickness of an electrically conductive material. This opening, cut-out or slit in its simplest form may be configured in a circular, ovular or a rectangular geometric shape. However, the opening may be configured in a plurality of non-limiting geometric shapes or pattern of openings. For example, the opening may comprise a logo, company name, or emblem of a product manufacturer. In addition, the opening may provide additional device functionality such as an opening for a camera lens, a fingerprint sensor, or an opening for additional device control or input port.

In one or more embodiments, the opening may comprise at least one slit that extends through the thickness of the electrically conductive material and traverses from a location within the electrically conductive material. In one or more embodiments, the at least one slit may radially extend from a cut-out pattern to or through an edge of the electrically conductive material, such as a metallic backing of a device. The primary objective of the slit is to prevent the formation of an eddy current loop on the surface of the electrically conductive material. Such eddy current loops on the surface of an electrically conductive material disrupt wireless transmission of electrical energy via NFMC.

Thus, by alternating the circulation path of the eddy current on the surface of the electrically conductive material, the opposed magnetic fields produced by the eddy current is modified, thereby allowing for wireless transmission of electrical energy through the electrically conductive material via NFMC.

In one or more embodiments, a magnetic field shielding material, such as a ferrite material, may also be incorporated within the antenna sub-assembly comprising the electrically conductive material with the at least one cutout and slit. Such magnetic shielding materials may be used to strategically block the opposing magnetic fields created by the eddy current, thus improving the amount and efficiency of the wirelessly transmitted electrical energy.

DETAILED DESCRIPTION

In the following description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various embodiments illustrated in the present disclosure provide for the wireless transfer of electrical energy and/or data. More specifically, the various embodiments of the present disclosure provide for the wireless transfer of electrical energy and/or data via near field magnetic coupling through a metallic material, such as a metallic backing or metallic casing of an electronic device.

Figure 1:
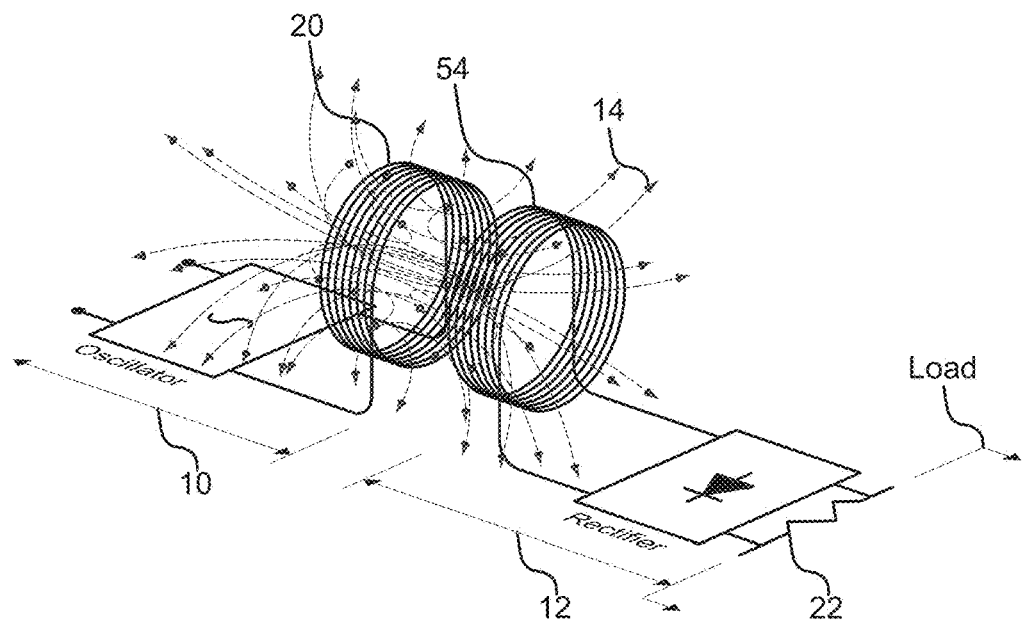
FIG. 1 illustrates an embodiment of wireless transmission of electrical energy via near-field magnetic coupling between a transmitting antenna and a receiving antenna.

Referring to FIG. 1, in inductive coupling, electrical power is transferred between a transmitting antenna 10 that is spaced from a receiving antenna 12 by an incident oscillating magnetic field 14. The incident oscillating magnetic field 14 is generated by the transmitting antenna 10 and is received by the receiving antenna 12. An alternating current (AC) through the transmitting antenna 12 creates the incident oscillating magnetic field 14 by Ampere's law. The incident oscillating magnetic field 14 passes through the receiving antenna 12, where it induces an alternating electromotive force (EMF) voltage by Faraday's law of induction, which thus creates an alternating current in the receiving antenna 12.

Figure 2:
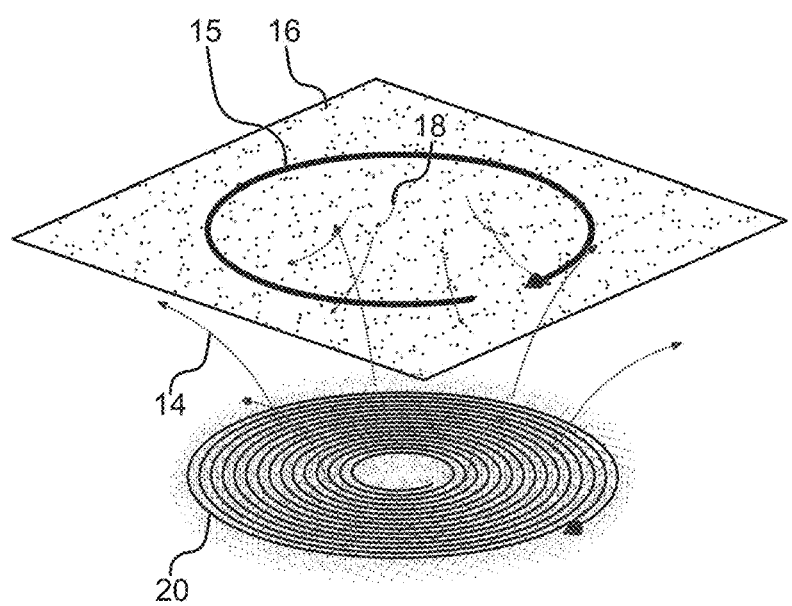
FIG. 2 shows an embodiment of the interaction between an incident magnetic field from a transmitting antenna and opposing magnetic field generated by an eddy current.

However, as illustrated in FIG. 2, when an oscillating magnetic field, such as an incident magnetic field 14 emanating from a transmitting antenna 10, interacts with an electrically conductive material 16, such as a metal, a circulating eddy current 15 is induced on the surface of the conductive material 16 as described by Faraday's Law. Further, a secondary magnetic field 18, in opposition to the incident oscillating magnetic field 14, is generated by the circulating eddy currents as described by Lenz's law. FIG. 2 illustrates this phenomenon in which an incident magnetic field 14 emanating from a transmitting antenna coil 20 interacts with an electrically conductive material 16, such as a sheet of metal. As shown, the interaction of the incident magnetic field 14 with the metal sheet causes an eddy current 15 to flow on the surface of the metal sheet in a clockwise direction. The formation of the eddy current on the metal sheet surface thus causes a secondary magnetic field 18 to emanate from the eddy current in an opposite direction to that of the incident magnetic field 14 emanating from the coil of the transmitting antenna 10. As a result, the secondary magnetic field 18 generated by the eddy current negates at least a portion of the incident magnetic field 14 from the transmitting antenna 10, thereby causing the magnitude of the incident magnetic field 14 to be diminished or cancelled out. Therefore, wireless transmission of electrical energy between the transmitting and receiving antennas 10, 12 is significantly impeded or prevented.

For example, if the incident magnetic field 14 from the transmitting antenna 10 is $H_1$, and the opposing secondary magnetic field 18 generated by the eddy current emanating from the electrically conductive material 16 is $H_2$, then the resultant magnetic field is $H_{NET}=H_1-H_2$. Thus, the interaction of the two magnetic fields 14, 18 reduces or may cancel the magnitude of the incident magnetic field 14 emanating from the transmitting antenna 10, thereby significantly reducing the amount or entirely blocking electrical energy from being wirelessly transmitted to a device 22 (FIG. 1) comprising the electrically conductive material.

In addition, the circulating eddy current may cause undesirable heating of the electrically conductive material 16. Such heating may not only result in loss of wireless energy but also could result in damage to other device components and circuitry due to the increased heat. Currently, materials through which NFMC wireless energy can transfer without deleteriously affecting the magnetic flux lines are limited to non-conductive materials, such as glass. However, such compatible materials are limited and may prevent desired device design and structural performance attributes. Furthermore, in an environment with various materials with varying electrical and magnetic properties, multiple eddy current effects may be created that negatively affect wireless electrical energy transmission via NFMC and also may result in undesirable heating of the device 22.

The intensity and location of the opposing secondary magnetic fields 18 depend on the magnitude and path of the eddy currents on the surface of the electrically conductive material 16. Thus, by creating appropriate cut-out and/or slit patterns that extend through the thickness of an electrically conductive material, eddy current patterns are modified such that electrical energy is able to be transmitted wirelessly, efficiently and undisturbed through the material 16.

As will be discussed and illustrated in the various embodiments, the present disclosure provides for various opening configurations, including but not limited to a cut-out, a slit, or a combination thereof, that alters the path of the eddy current on the surface of the electrically conductive material 16 and thus mitigates the magnitude of the opposing secondary magnetic field 18 created by the eddy current. As a result, the magnetic flux of the secondary magnetic field 18 is significantly reduced in the area of the cut-out/slit pattern.

Furthermore, the use of the cut-out and/or slit pattern of the present disclosure may intensify the eddy current within the cut-out/slit pattern. As a result, the magnetic flux of the incident magnetic field 14 from the transmitting antenna 10 is increased in the cut-out/slit pattern. This increase in magnetic flux of the incident magnetic field 14 from the transmitting antenna 10 increases mutual inductance between the transmitting and receiving antennas 10, 12 and, in turn, increases the efficiency of wireless electrical energy transfer between the two antennas.

Figure 3:
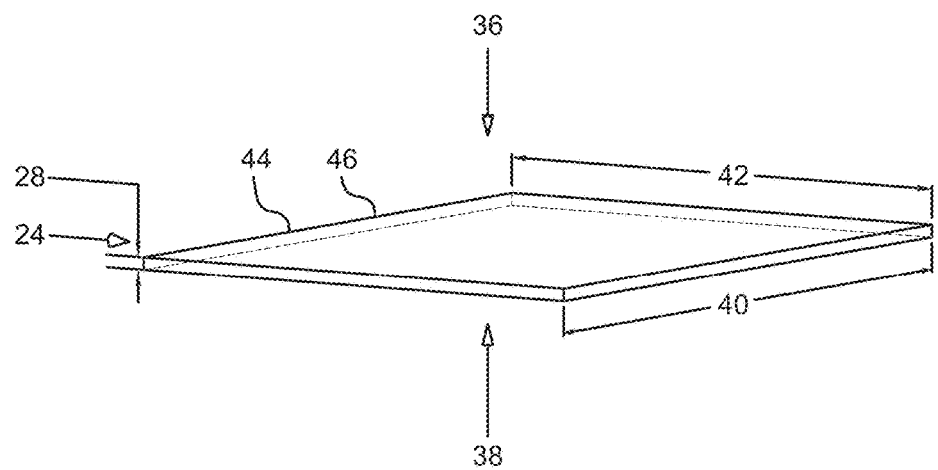
FIG. 3 illustrates an embodiment of a substrate of an electrically conductive material through which a slit, a cut-out, or combination thereof is configured to extend therethrough.

In one or more embodiments, the present disclosure provides at least one substrate 24 as illustrated in FIG. 3 that comprises an electrically conductive material, such as a metal. The substrate 24 may have at least one opening of various configurations as illustrated in FIGS. 7 through 24. In an embodiment, the opening may comprise a cut-out 30, as shown in FIGS. 7 through 10, a slit 32, as shown in FIGS. 11 through 19 or a combination thereof as shown in FIGS. 20 through 24.

In one or more embodiments, the slit 32, cut-out 30, or combination thereof prevents the formation of an eddy current loop at the periphery of the electrically conductive material 16. The formation of an eddy current loop at the periphery of an electrically conductive material 16 disrupts the wireless transmission of electrical energy via NFMC. In addition, the cut-out 30 and/or slit 32 pattern changes the direction of the eddy current such that it creates a magnetic field having the same polarity as the incident magnetic field 14 created by the transmitting antenna 10. This, therefore, helps to improve antenna-to-antenna efficiency.

In one or more embodiments, the cut-out 30 and/or slit 32 pattern of the present application is specifically designed to improve mutual inductance and transmitting antenna to receiving antenna efficiency without adding additional turns to the coil of the receiving antenna 12 or increasing the permeability or thickness of a magnetic shielding material 34, such as a ferrite material, that may be positioned behind the receiving antenna 12. As such, the present disclosure improves the efficiency of wireless energy transfer between the transmitting and receiving antennas 10, 12 by decreasing the equivalent series resistance (ESR) and increasing the inductance and quality factor of the receiving antenna 12 that is positioned adjacent to an electrically conductive substrate 24 comprising the cut-out/slit pattern of the present application.

In this application, the inventive concepts particularly pertain to near-field magnetic coupling (NFMC). NFMC enables the transfer of electrical energy and/or data wirelessly through magnetic induction between a transmitting antenna 10 and a corresponding receiving antenna 12. The NFMC standard, based on near-field communication interface and protocol modes, is defined by ISO/IEC standard 18092. Furthermore, as defined herein "inductive charging" is a wireless charging technique that utilizes an alternating electromagnetic field to transfer electrical energy between two antennas. "Resonant inductive coupling" is defined herein as the near field wireless transmission of electrical energy between two magnetically coupled coils that are tuned to resonate at a similar frequency. As defined herein, "mutual inductance" is the production of an electromotive force in a circuit by a change in current in a second circuit magnetically coupled to the first circuit.

As defined herein a "shielding material" is a material that captures a magnetic field. Examples of shielding material include, but are not limited to ferrite materials such as zinc comprising ferrite materials such as manganese-zinc, nickel-zinc, copper-zinc, magnesium-zinc, and combinations thereof. A shielding material thus may be used to direct a magnetic field to or away from an object, such as a parasitic metal, depending on the position of the shielding material within or nearby an electrical circuit. Furthermore, a shielding material can be used to modify the shape and directionality of a magnetic field. As defined herein a parasitic material, such as a parasitic metal, is a material that induces eddy current losses in the inductor antenna. This is typically characterized by a decrease in inductance and an increase in resistance of the antenna, i.e., a decrease in the quality factor. An "antenna" is defined herein as a structure that wirelessly receives or transmits electrical energy or data. An antenna comprises a resonator that may comprise an inductor coil or a structure of alternating electrical conductors and electrical insulators. Inductor coils are preferably composed of an electrically conductive material such as a wire, which may include, but is not limited to, a conductive trace, a filar, a filament, a wire, or combinations thereof.

It is noted that throughout this specification the terms, "wire", "trace", "filament" and "filar" may be used interchangeably. As defined herein, the word "wire" is a length of electrically conductive material that may either be of a two dimensional conductive line or track that may extend along a surface or alternatively, a wire may be of a three dimensional conductive line or track that is contactable to a surface. A wire may comprise a trace, a filar, a filament or combinations thereof. These elements may be a single element or a multitude of elements such as a multifilar element or a multifilament element. Further, the multitude of wires, traces, filars, and filaments may be woven, twisted or coiled together such as in a cable form. The wire as defined herein may comprise a bare metallic surface or alternatively, may comprise a layer of electrically insulating material, such as a dielectric material that contacts and surrounds the metallic surface of the wire. A "trace" is an electrically conductive line or track that may extend along a surface of a substrate. The trace may be of a two dimensional line that may extend along a surface or alternatively, the trace may be of a three dimensional conductive line that is contactable to a surface. A "filar" is an electrically conductive line or track that extends along a surface of a substrate. A filar may be of a two dimensional line that may extend along a surface or alternatively, the filar may be a three dimensional conductive line that is contactable to a surface. A "filament" is an electrically conductive thread or threadlike structure that is contactable to a surface. "Operating frequency" is defined as the frequency at which the receiving and transmitting antennas operate. "Self-resonating frequency" is the frequency at which the resonator of the transmitting or receiving antenna resonates.

As defined herein a "slit" is an opening having a length, a width oriented perpendicular to the length and a depth that extends through the substrate thickness, wherein the length is greater than the width. A "cut-out" or a "cut-out portion" is defined herein as an opening having an area that is oriented about perpendicular to a depth that extends through a substrate thickness. The area may be configured of a plurality of geometric shapes that include, but are not limited to an oval, a circle, a square, a rectangle, a triangle, a hexagon, an octagon, or any non-limiting polygon shape. In one or more embodiments, the area of the slit and "cut-out" are co-planar to a surface of the substrate that is perpendicular to the substrate thickness.

FIG. 3 illustrates one or more embodiments of the substrate 24 composed of an electrically conductive material through which the cut-out 30, slit 32 or combination thereof extends therethrough. As shown, the substrate 24 comprises a first substrate surface 36 opposed from a second substrate surface 38, a thickness 28 extends therebetween. In one or more embodiments, the thickness 28 of the substrate may range from about 0.01 mm to about 0.10 mm. The substrate 24 further comprises a length 40 and a width 42 oriented about perpendicular to the length 40. In one or more embodiments, the first and second substrate surfaces 36, 38 comprises a perimeter 44 having an edge 46 that defines a first and second surface area of the respective first and second substrate surfaces 36, 38. In one or more embodiments, the substrate 24 comprises an electrically conductive material, examples of which are not limited to copper, aluminum, steel, and nickel.

Figure 4:
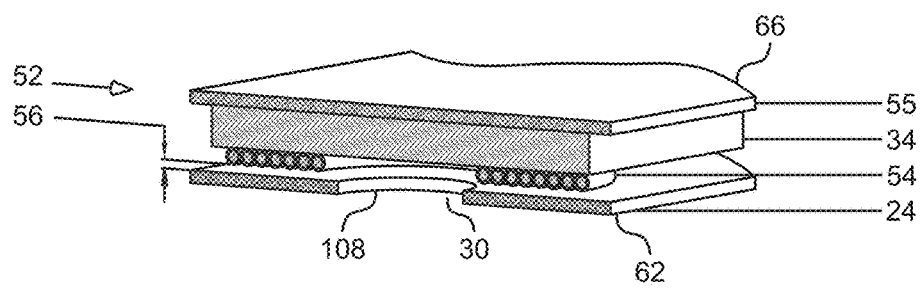
FIGS. 4 and 5 illustrate embodiments of antenna sub-assembly configurations that may be used with an electrically conductive substrate having at least one cut-out and/or slit.

FIG. 4 illustrates a cross-sectional view of one or more embodiments of a stack up configuration of a wireless electrical energy receiving sub-assembly 52 comprising a receiving coil 54 of a receiving antenna 12, a magnetic field shielding material 34, an electrically conductive substrate 24, and a second electrically conductive substrate 55. As shown, the substrate 24 is configured with a cut-out 30. Alternatively, the substrate 24 may be configured with a slit 32 or a combination of a slit 32 and cutout 30. The sub-assembly 52 is designed to be incorporated within an electronic device 22 configured to be electrically powered or electrically charged through transmission of wireless electrical energy via NFMC. Examples of such electronic devices 22 may include, but are not limited to a cellular phone, a radio, a television, a computer, a medical device, a device that comprises an electronic circuit or any device that operates via electrical power.

In one or more embodiments, the substrate 24 comprising the cut-out 30, slit 32, or combination thereof of the present disclosure is positioned adjacent to the receiving coil 54 of a receiving antenna 12 configured to receive electrical energy wirelessly transmitted via NFMC. As such, positioning the cut-out 30, slit 32, or a combination thereof adjacent to the receiving coil 54 of the receiving antenna 12 disrupts the circular path of the eddy current on the surface of the electrically conductive substrate 24. In addition, positioning the cut-out 30, slit 32, or combination thereof adjacent to the receiving coil 54 of the receiving antenna 12 allows for the eddy current 15 to flow within the cut-out and/or slit pattern in the same direction as the wirelessly transmitted electrical energy, thus, the magnetic flux of the incident magnetic field 14 from the transmitting antenna 10 is increased as the incident magnetic field 14 travels through the cut-out and/or slit pattern of the electrically conductive substrate 24. Thus, the equivalent series resistance (ESR) of the receiving antenna 12 is reduced, and the inductance and quality factor of the receiving antenna 12 is increased. As a result, mutual inductance and efficiency between the transmitting and receiving antennas 10, 12 is increased which enables efficient wireless transmission of electrical energy through the electrically conductive substrate 24. It is further contemplated that the electrically conductive substrate 24 comprising the cut-out 30, slit 32 or combination thereof, may be positioned adjacent to a transmitting coil 20 of the transmitting antenna 10.

In one or more embodiments, as shown in FIG. 4, a gap 56 may be positioned between the electrically conductive substrate 24 and the receiving coil 54 of the receiving antenna 12. Alternatively, the gap 56 may also be positioned between the electrically conductive substrate 24 and the transmitting coil 20 of the transmitting antenna 10. In one or more embodiments, the gap 56 separating the electrically conductive substrate 24 from the transmitting or receiving antenna coil 20, 54 may extend from about 0.1 mm to about 10 mm. In one or more embodiments, the gap 56 between the receiving or transmitting coil 54, 20 reduces the proximity effect that may develop between the substrate 24 and the receiving or transmitting coil 54, 20. Such a proximity effect may degrade the mutual inductance between the transmitting and receiving antennas 10, 12.

Figure 5:
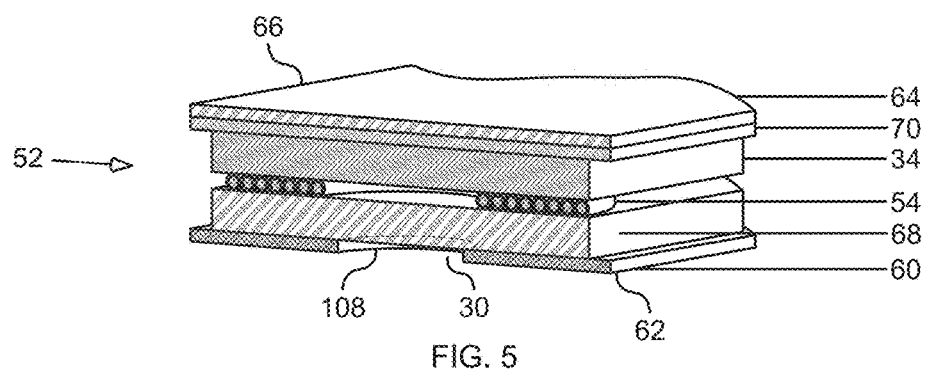

In addition, a shielding material 34, such as a ferrite, may be positioned facing a side of the transmitting or receiving antenna 10, 12 opposite an opposite side facing the substrate 24 comprising the cut-out/slit pattern. In one or more embodiments, the shielding material 34 may be positioned in contact with the transmitting or receiving antenna 10, 12 or may be spaced from the antenna by a shielding material gap. In one or more embodiments, as illustrated in FIGS. 4 and 5, the coil of the transmitting or receiving antenna 10, 12 may be positioned directly on a surface of the shielding material 34, such as a ferrite. In one or more embodiments, the shielding material 34 serves as the structural support substrate in addition to preventing the interaction of the incident magnetic field 14 and the secondary magnetic field 18 with the electrical components and circuitry of the device 22. In one or more embodiments, when incorporated with the receiving antenna 12, the shielding material 34 may be used to minimize magnetic fields emanating from the receiving coil 54. Such magnetic fields from the receiving coil 54 may adversely interfere with the incident magnetic field 14 from the transmitting antenna 10. In addition, as shown in FIG. 4, the second electrically conductive substrate 55 is positioned adjacent to the magnetic shielding material 34. As shown, the surface of the magnetic shielding material 34, opposite the receiving coil 54, is in contact with the second electrically conductive substrate 55. In one or more embodiments, the second electrically conductive substrate 55 may comprise a metal such as copper, aluminum, nickel, or a combination thereof. The second electrically conductive substrate 55 may comprise a backing to provide structural support.

In one or more embodiments, the shielding material 34 may be a ferrite material with a loss tangent as low as possible. In one or more embodiments, the loss tangent of the ferrite material may be equal to or less than 0.70 at the antenna operating frequency. Such shielding materials may include, but are not limited to, zinc comprising ferrite materials such as manganese-zinc, nickel-zinc, copper-zinc, magnesium-zinc, and combinations thereof. These and other ferrite material formulations may be incorporated within a polymeric material matrix so as to form a flexible ferrite substrate. Examples of such materials may include but are not limited to, FFSR and FFSX series ferrite materials manufactured by Kitagawa Industries America, Inc. of San Jose, Calif. and Flux Field Directional RFIC material, manufactured by 3M™ Corporation of Minneapolis, Minn. In one or more embodiments, the transmitting or receiving antenna 10, 12 incorporated with the shielding material 34, such as a ferrite material, should have a self-resonance frequency (SRF)>1.5 times the operating frequency, preferably an SRF>3 times the operating frequency. For example, if the operating frequency is 6.78 MHz, then the SRF of the antenna should be greater than 10 MHz.

In one or more embodiments, the transmitting or receiving antenna 10, 12 may comprise at least one inductor coil such as the non-limiting examples disclosed in U.S. Pat. App. Nos. 2017/0040690, 2017/0040692, 2017/0040107, 2017/0040105, 2017/0040696, and 2017/0040688 all to Peralta et al., 2017/0040691, 2017/0040694 to Singh et al., 2017/0040693 to Luzinski and 2017/0040695 to Rajagopalan et al., all of which are assigned to the assignee of the present application and incorporated fully herein. In addition, the transmitting or receiving antenna 10, 12 may be configured in a multi-layer-multi-turn (MLMT) construction in which at least one insulator is positioned between a plurality of conductors. Non-limiting examples of antennas having an MLMT construction that may be incorporated with the present disclosure may be found in U.S. Pat. Nos. 8,610,530, 8,653,927, 8,680,960, 8,692,641, 8,692,642, 8,698,590, 8,698,591, 8,707,546, 8,710,948, 8,803,649, 8,823,481, 8,823,482, 8,855,786, 8,898,885, 9,208,942, 9,232,893, 9,300,046, all to Singh et al., and assigned to the assignee of the present application are incorporated fully herein. It is also noted that other antennas such as, but not limited to, an antenna configured to send and receive signals in the UHF radio wave frequency such IEEE standard 802.15.1 may be incorporated within the present disclosure.

In one or more embodiments, the inductor coils 20, 54 of either the transmitting or receiving antennas 10, 12 are strategically positioned to facilitate reception and/or transmission of wirelessly transferred electrical power or data through near field magnetic induction. Antenna operating frequencies may comprise all operating frequency ranges, examples of which may include, but are not limited to, about 100 kHz to about 200 kHz (Qi interface standard), 100 kHz to about 350 kHz (PMA interface standard), 6.78 MHz (Rezence interface standard), or alternatively at an operating frequency being employed by a device in a proprietary recharging mode. In addition, the antenna 10, 12 of the present disclosure may be designed to receive or transmit over a wide range of operating frequencies on the order of about 1 kHz to about 1 GHz or greater, in addition to the Qi and Rezence interfaces standards.

FIG. 5 illustrates one or more embodiments of a stack up configuration of a wireless electrical energy receiving sub-assembly 52. In one or more embodiments, the wireless electrical energy receiving sub-assembly 52 may be incorporated within an electronic device 22 configured to be electrically powered or electrically charged through transmission of wireless electrical energy via near-field magnetic coupling (NFMC). As shown, the stack-up configuration comprises a receiving antenna coil 54 positioned directly on a surface of a shielding material 34, i.e., a ferrite material. The shielding material 34 and the receiving antenna coil 54 are sandwiched between a first electrically conductive substrate 60 located at a stack-up proximal end 62 and an electrically insulative substrate 64 located at a stack-up distal end 66. In an embodiment, a spacer 68 composed of an electrically insulative material, such as a polymeric material, may be positioned between the first electrically conductive substrate 60 and the receiving antenna coil 54. In one or more embodiments, a second electrically conductive substrate 70 may be positioned between the shielding material 34 and the electrically insulative substrate 64. As shown in FIG. 5, the first electrically conductive substrate is configured with a cut-out 30. Alternatively, the first electrically conductive substrate 60 may be configured with a slit 32 or a combination of a slit 32 and a cutout 30. In one or more embodiments, the spacer 68 is a substrate composed of an electrically insulative material, such as a polymeric material. In one or more embodiments, the spacer 68 serves to provide a gap between the receiving antenna coil 54 and the first electrically conductive substrate 60. In one or more embodiments, the spacer 68 is designed to minimize the proximity effect between the inductor coil 54 and the first substrate 60. Positioning the first substrate 60 adjacent to the receiving antenna coil 54, may cause a proximity effect to develop between the receiving antenna coil 54 and the first substrate 60 that may increase the electrical resistance, i.e., ESR, of the receiving antenna coil 54. Thus, by positioning the electrically non-conductive polymer spacer 68 between the first substrate 60 and the receiving antenna coil 54, the proximity effect between the receiving antenna coil 54 and the first substrate 60 is reduced and the inductance of the receiving antenna coil 54 does not decrease. In one or more embodiments, the spacer 68 may have a thickness that ranges from about 0.1 mm to about 10 mm.

In one or more an embodiments, the electrically insulative substrate 64 is positioned adjacent to the second electrically conductive substrate 70 opposite the side contacting the shielding material 34. In one or more embodiments, the second electrically conductive substrate 70 is composed of an electrically conductive material, non-limiting examples include, but are not limited to copper, nickel, aluminum or a combination thereof. In one or more embodiments, the second electrically conductive substrate 70 may comprise a structural backing, a printed circuit board (not shown) or a sidewall of a battery (not shown). The electrically insulative substrate 64 is intended to provide mechanical stability to the structure of the sub-assembly stack-up configuration.

Figure 6:
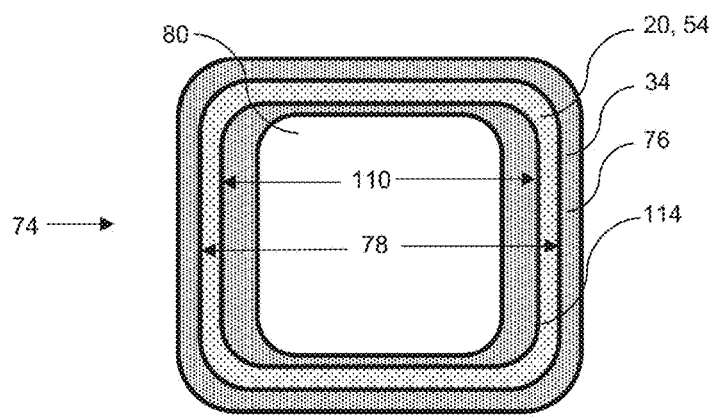
FIG. 6 illustrates an embodiment of an antenna coil and shielding material sub-assembly.

FIG. 6 illustrates one or more embodiments of a coil and shielding material sub-assembly 74. The coil may be a receiving coil 54 or a transmitting coil 20. Both coils may be similarly constructed. As shown, a coil 20, 54 comprising a plurality of filars arranged with at least one turn, is positioned directly on a surface of the shielding material 34, i.e., a ferrite material. In one or more embodiments, the coil 20, 54 is positioned on the surface of the shielding material 34 such that an overhang 76 of the shielding material 34 extends circumferentially around an outer diameter 78 of the coil 20, 54. In one or more embodiments, the overhang 76 may extend from about 0.5 mm to about 5 mm. Thus, by extending the length and width of the shielding material 34 with respect to the position of the coil 20, 54 to the overhang 76, opposing magnetic fields that are generated by the coil 20, 54 are diminished. Thus, an increase in inductance and mutual inductance of the antenna is achieved.

As further illustrated in FIG. 6, the shielding material 34 may comprise an opening 80 that extends through the thickness of the shielding material 34. The coil 20, 54 is positioned circumferentially around the opening 80. Such a shielding material configuration comprising the opening 80 may be beneficial in applications where the coil 20, 54 and the shielding material sub-assembly 74 are positioned at a distance from metallic objects. Constructing the shielding material 34 with an opening 80 that extends through the thickness of the shielding material 34 decreases the electrical resistance of the coil 20, 54. However, the opening 80 in the shielding material 34 may decrease the inductance of the coil 20, 54. Therefore, the shielding material opening 80 should be dimensioned accordingly to meet the requirements of the application.

FIGS. 6A, 6B, 6C, and 6D are cross-sectional views illustrating various embodiments in which a transmitting inductor coil 20 or a receiving inductor coil 54 comprising an electrically conductive trace 82 may be constructed using materials that shield the inductor coils 20, 54 from magnetic fields 106. It is noted that the embodiments shown in FIGS. 6A-6D may comprise a transmitting inductor coil 20 or a receiving inductor coil 54. Furthermore, in one or more embodiments, the inductor coil 20, 54 comprises an interior inductor coil 84 surrounded by an outer inductor coil 86. In one or more embodiments as illustrated in the cross-sectional views of FIGS. 6A-6D, first and second segments 88, 90 comprise the outer inductor coil 86 and third and fourth segments 92, 94 comprise the inner inductor coil 84.

As shown in the various embodiments, three different magnetic shielding materials such as, a first material 96, a second material 98 and a third material 100, each having a different permeability, loss tangent, and/or magnetic flux saturation density may be used in the construction of the antenna of the present disclosure. In one or more embodiments, the first material 96 may comprise at least one of the FFSX series of ferrite materials having a permeability of about 100 to about 120 across a frequency range of at least 100 kHz to 7 MHz. The second material 98 may comprise the RFIC ferrite material having a permeability of about 40 to about 60, and the third material 100 may also comprise a ferrite material or combinations thereof, as previously mentioned. In one or more embodiments, the first 96, second 98, or third 100 materials may comprise a permeability greater than 40. More preferably, the first 96, second 98, or third 100 materials may comprise a permeability greater than 100. The magnetic flux saturation density (Bsat) is at least 380 mT.

Figure 6A:
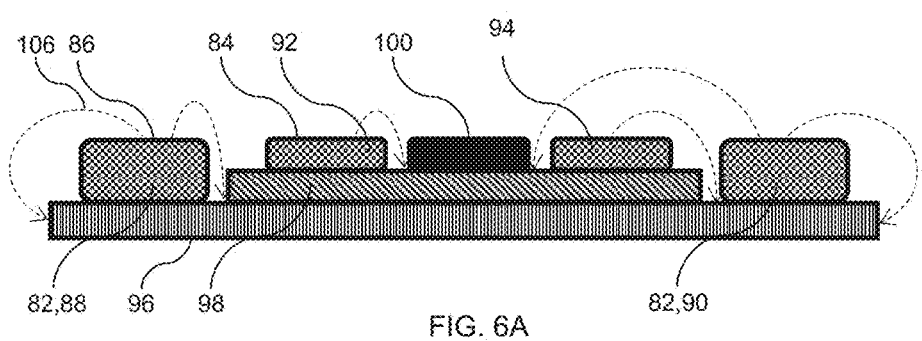
FIGS. 6A-6D illustrate cross-sectional views of different embodiments of a receiving or transmitting antenna of the present disclosure with different ferrite material shielding configurations.

FIG. 6A shows one or more embodiments in which the inductor coils 84, 86, are positioned directly on an exterior surface of the ferrite materials. As shown, the first and second ferrite materials 96, 98 serve as substrate layers on which the inductive coils are positioned. The third ferrite material 100 is preferably positioned within a central location between the coil winding, i.e., between the third and fourth inductor coil segments 92, 94. Note that each inductor coil segment could represent multiple traces of inductor coil turns. In one or more embodiments the first and second segments 88, 90 of the outer inductive coil 86 are shown positioned directly on a surface of a first layer of the first ferrite material 96 and the interior coil segments 92, 94 of the interior inductive coil 84 are positioned directly on the surface of a second layer of the second ferrite material 98. The second layer of the second ferrite material 98 is positioned on top of the first layer of the first ferrite material 96. A third layer of the third ferrite material 100 is positioned directly on the second layer of the second ferrite material 98. In one or more embodiments, the first, second and third layers of the different ferrite materials 96, 98, and 100 are positioned such that magnetic fields 106 generated by the inductive coils 20, 54 are absorbed by the ferrite materials. Furthermore, the selection of the ferrite material may be based on the material used to construct the conductive lines as well as the amount of the current or voltage flowing therethrough.

In one or more embodiments, the various magnetic shielding materials 34 and structures could be used to create a hybrid magnetic shielding embodiment. In a hybrid magnetic shielding embodiment, various ferrite materials are strategically positioned to improve the performance of the multiple inductor coils 20, 54 which resonate at differing frequencies. Thus, the ferrite materials are positioned to enhance the operation of the transmitting or receiving antenna 10, 12. For example, utilizing a ferrite material having an increased permeability of about 100 to 120, such as the FFSX series material may be used to optimally shield a coil resonating at 6.78 MHz without degrading the performance of another coil resonating at a lower frequency range of 100 kHz to about 500 kHz. Likewise, utilization of a ferrite material having a lower permeability such as from about 40 to about 60, like the RFIC material, is preferred because it enhances the operation of a coil 20, 54 resonating in the lower kHz frequency region without degrading the performance of an inductor coil 20, 54 resonating in the MHz frequency range.

In addition to the specific ferrite material, the positioning of the ferrite material is also important to the optimal operation of the antenna of the present disclosure. For example with reference to FIGS. 6A through 6D, it may be preferred to position a higher permeability ferrite material near an inductor coil 20, 54 configured to resonate at a higher frequency, such as the relative location of the first ferrite material 96 as shown in FIGS. 6A-6D. Similarly, it may be beneficial to position a ferrite material having a lower permeability near an inductor coil 20, 54 configured to resonate in the kHz range such as the location of the second ferrite material 98. The third ferrite material 100 could be a material that has similar properties as the second ferrite material 98 or, alternatively, the third ferrite material 100 could be a material that has a high magnetic saturation that preserves the magnetic performance of the other materials in the presence of an antenna. For example, an antenna that comprises a magnet. In one or more embodiments, the various ferrite materials 96, 98, and 100 may act as an attractor to help affix to inductor coils 20, 54 that comprise a magnet.

Figure 6B:
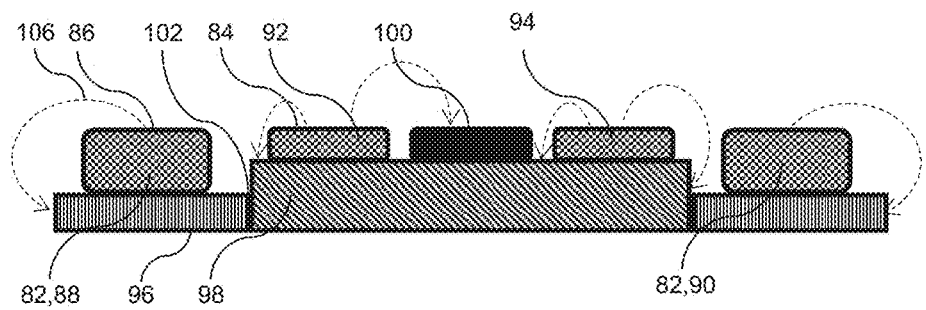

FIG. 6B illustrates one or more embodiments of the construction of the antenna of the present disclosure in which the second ferrite material 98 is positioned within a cavity 102 formed within the first ferrite material 96. In addition, the height of the second ferrite material 98 is greater than the height of the first ferrite material 96.

Figure 6C:
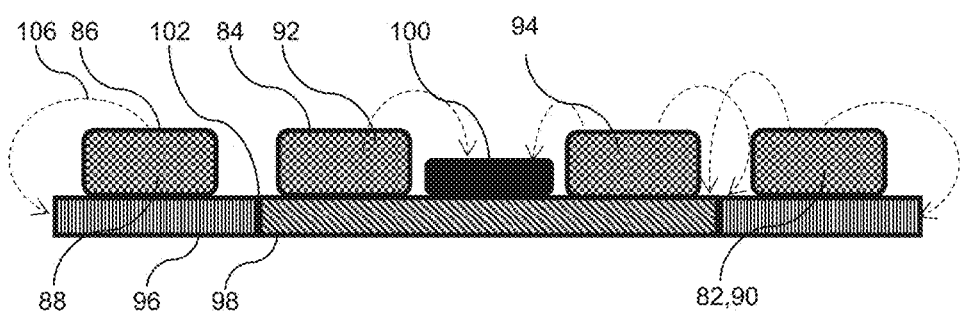
Figure 6D:
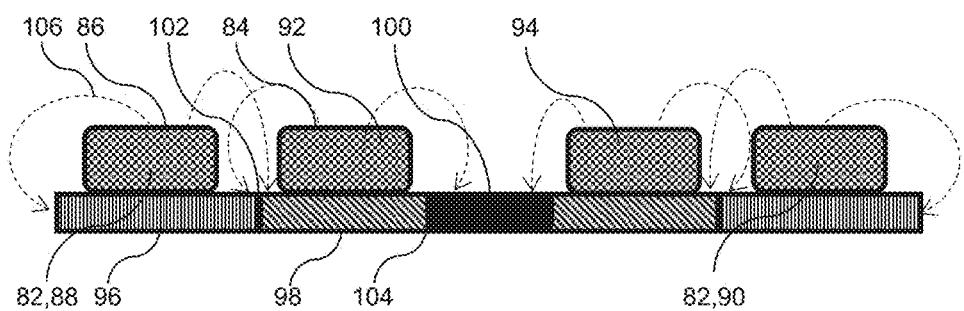

FIG. 6C illustrates one or more embodiments in which the second ferrite material 98 is positioned within a cavity 102 formed within the first ferrite material 96. However, in contrast to the embodiments shown in FIGS. 6A and 6B, the height of the respective first and second ferrite materials 96, 98 are about equal. Lastly, FIG. 6D shows one or more embodiments in which the third ferrite material 100 may be positioned within a second cavity 104 positioned within the second material layer 98. In addition, the second material 98 is positioned within the first cavity 102 formed within the first material 96. Furthermore, as shown in FIG. 6D, all three ferrite materials 96, 98 and 100 are positioned so that they are of about the same height. Specifically as shown, the third material 100 is positioned within the second cavity 104 of the second ferrite material 98, the second ferrite material 98 is positioned within the first cavity 102 of the first ferrite material 96 with all three ferrite material 96, 98, 100 being of about equal height. Therefore, the various ferrite materials may be positioned at different heights relative to each other such that magnetic fields 106 generated by adjacent conductive lines are optimally absorbed by the ferrite materials.

In addition to utilizing three ferrite materials as previously discussed, it is contemplated that mixtures or compounds of various ferrite materials may be used to further custom tailor the desired permeability. Furthermore, the various layers may be composed of ferrite material mixtures and alloys. It is also noted that FIGS. 6A-6D represents specific embodiments in which ferrite materials may be positioned within the structure of the antenna of the present disclosure. It is contemplated that the various first, second, and third ferrite materials 96, 98, 100 can be interchangeably positioned throughout the structure of the antenna to custom tailor a desired response or create a specific magnetic field profile.

In one or more embodiments, the electrically conductive substrate 24 comprising the at least one cut-out 30 and slit 32 of the present disclosure may serve as a casing, enclosure or backing such as a sidewall of a device 22 that at least partially encases the electrical components and circuitry of an electronic device 22. Alternatively, the electrically conductive substrate 24 comprising the at least one cut-out 30 and slit 32 may be positioned internal to an electronic device 22.

Figure 7:
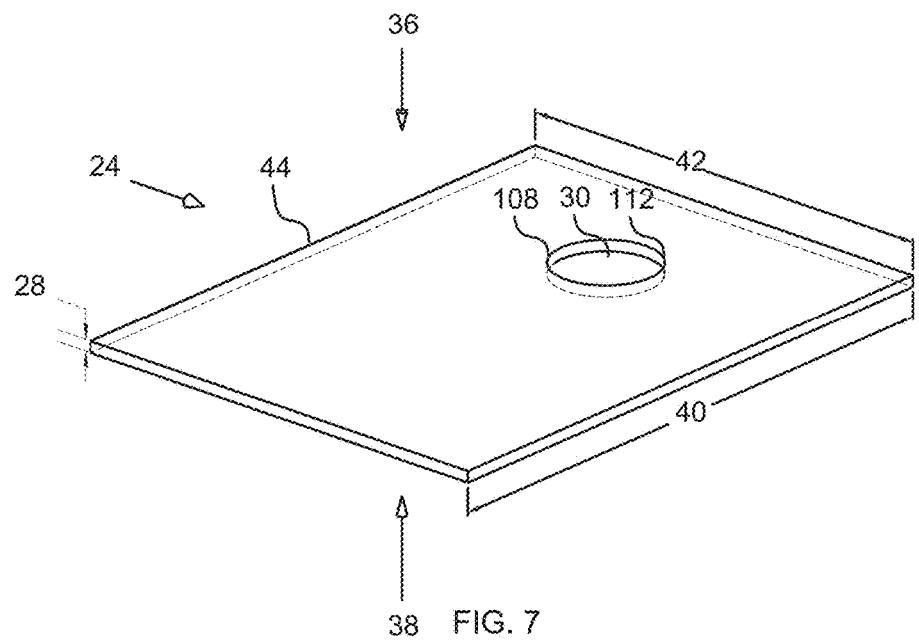
FIGS. 7-10 illustrate embodiments of cut-outs configured in various non-limiting geometries.
Figure 8:
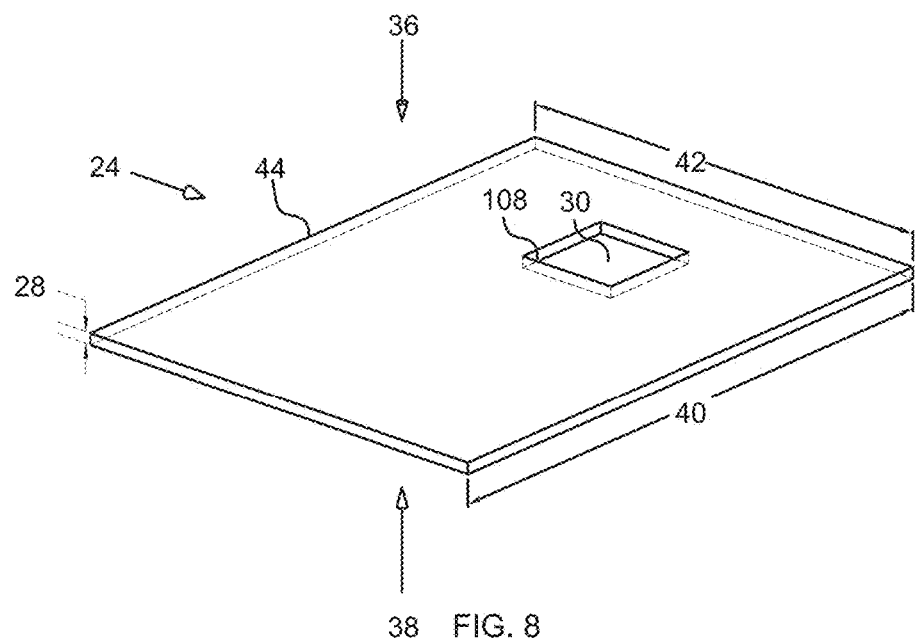
Figure 9:
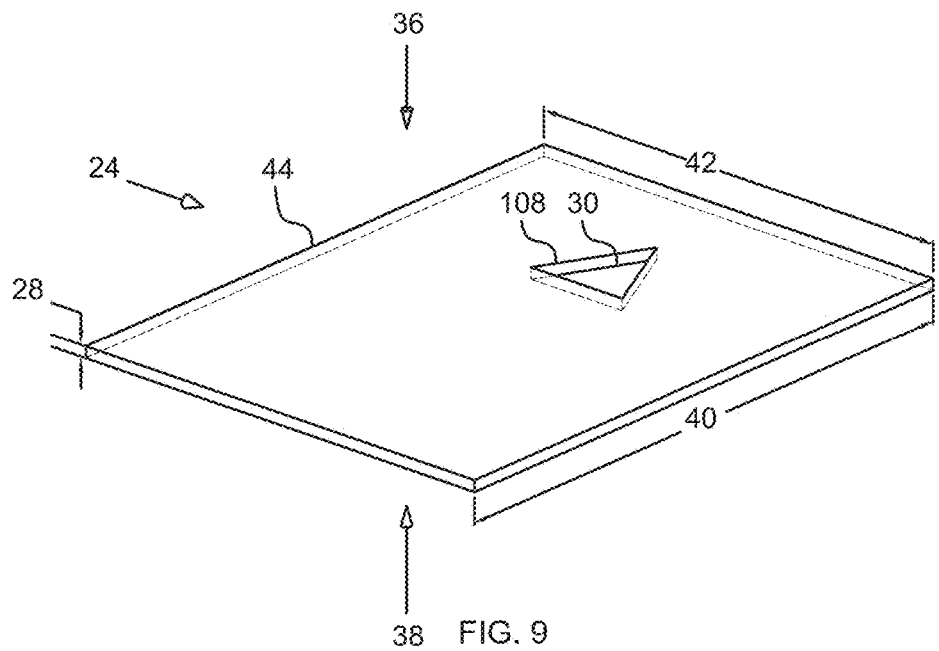
Figure 10:
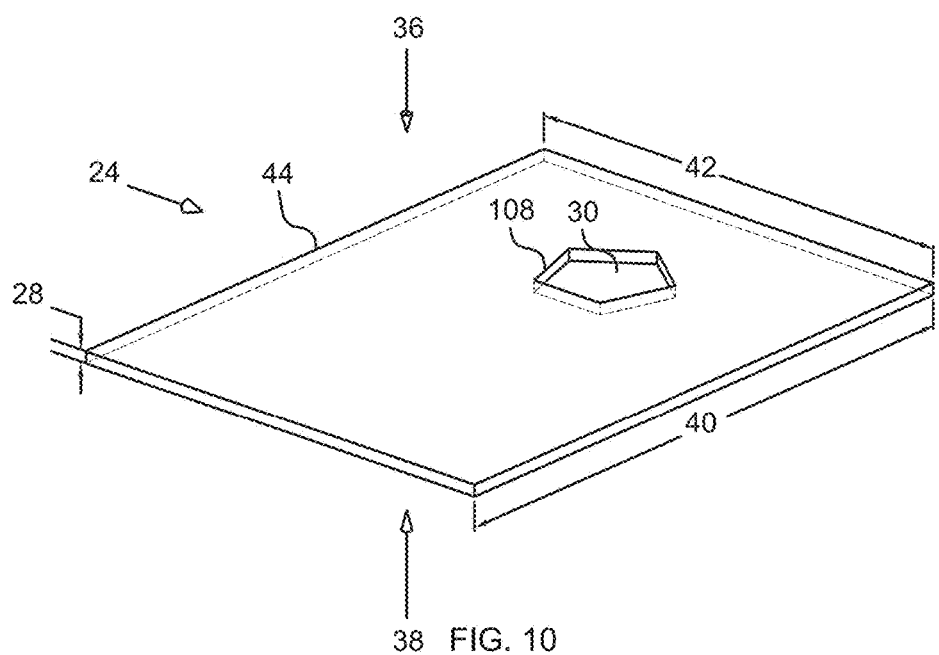

FIGS. 7 through 10 are perspective views that illustrate embodiments of the various non-limiting geometric shapes in which the cut-out 30 may be configured. FIG. 7 illustrates a cut-out 30 configured in a circular shape. FIG. 8 illustrates a cut-out 30 configured in a rectangular shape. FIG. 9 shows a cut-out 30 configured in a triangular shape and FIG. 10 illustrates a cut-out 30 configured in a pentagon shape.

In one or more embodiments, a perimeter 108 of the cut-out 30 (FIG. 7) should align with an inner diameter 110 (FIG. 6) of the inductor coil 54, 20 of the receiving or transmitting antenna 12, 10. For example, if the cut-out 30 is of a circular configuration with a diameter of about 20 mm, the inductor coil 54 of the receiving antenna 12, positioned adjacent to the cut-out 30, should have a coil diameter 110 of about 20 mm. In one or more embodiments, the diameter of the circular cut-out shape 30 should be positioned such that it is parallel to the inner diameter 110 of the coil pattern 20, 54 of the transmitting or receiving antenna 10, 12. In other words, the shape of the inductor coil 20, 54 of the transmitting or receiving antenna 10, 12 should be configured to closely mirror the geometric configuration of the cut-out 30 and be positioned such that the cut-out 30 and the inductor coil 20, 54 are parallel to each other. In one or more embodiments, the inductor coil 20, 54 and the electrically conductive substrate 24 comprising the cut-out 30 are aligned in parallel such that an imaginary line oriented perpendicular therebetween extends through a first point 112 (FIG. 7) that lies on the perimeter 108 of the cut-out 30 and a second point 114 (FIG. 6) that lies on the inner diameter 110 of the inductor coil 20, 54. An example of the alignment between the cut-out 30 and the receiving coil 54 is shown in FIGS. 4 and 5.

Figure 11:
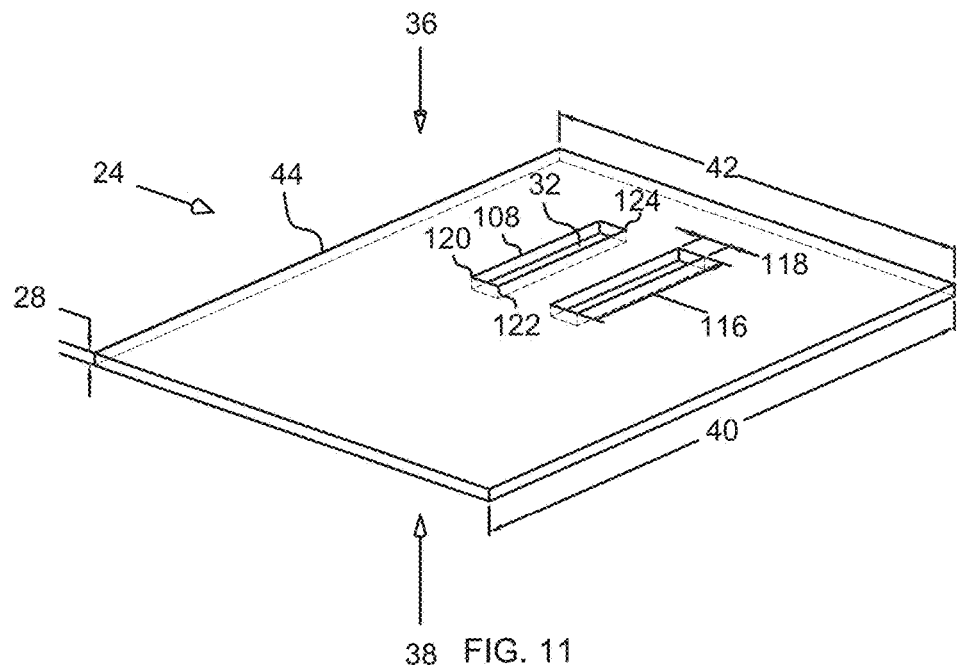
FIGS. 11-19 illustrate embodiments of various non-limiting slit configurations.
Figure 12:
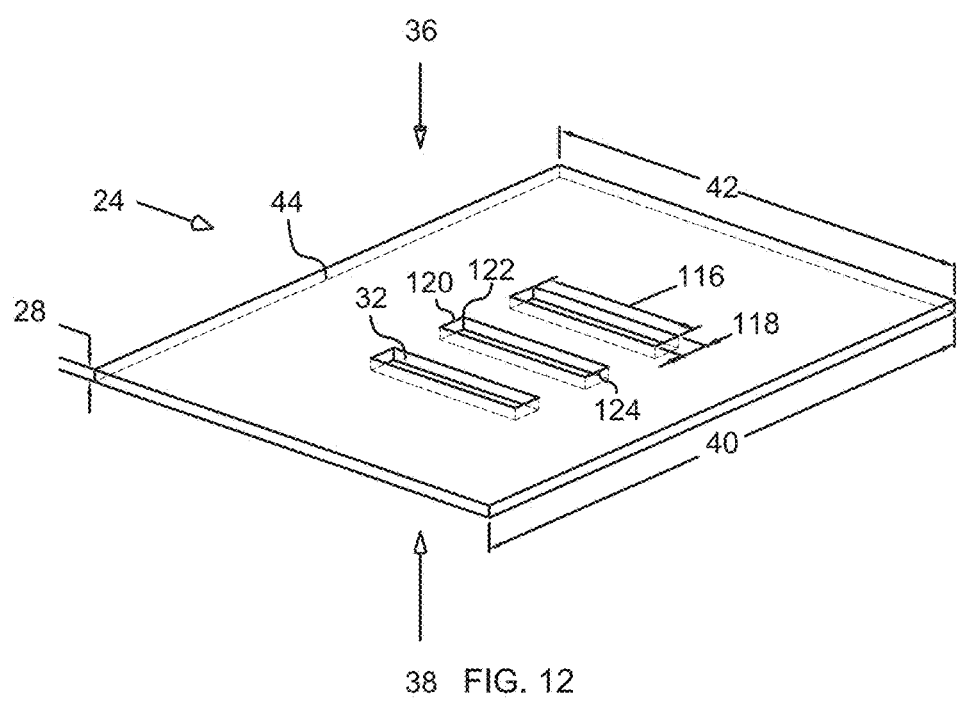
Figure 13:
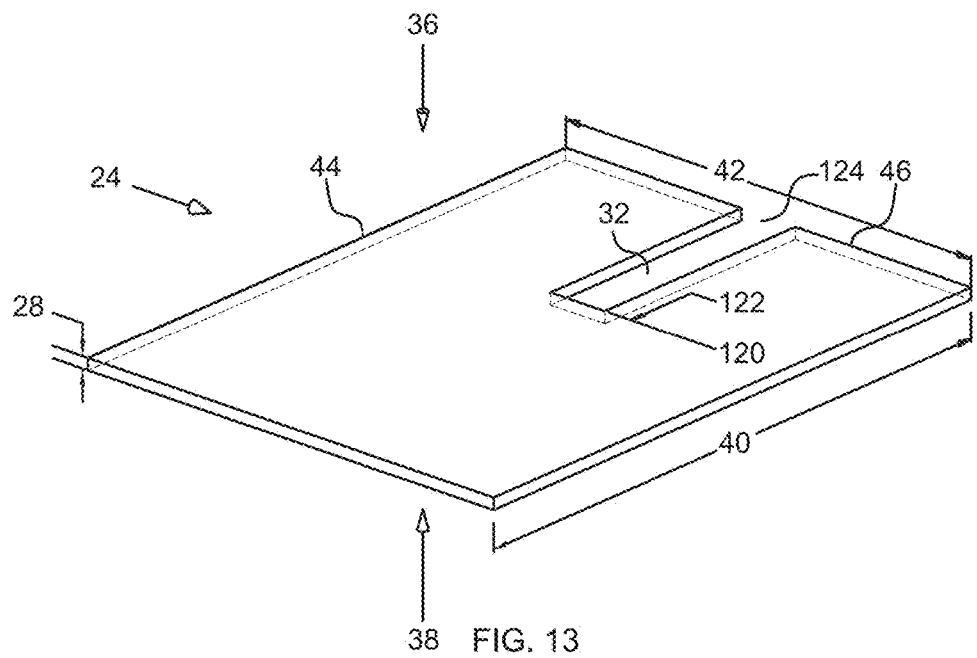

FIGS. 11 through 19 are perspective views that illustrate embodiments of various slit configurations. As illustrated the slit 32 comprises a slit length 116 oriented about perpendicular to a slit width 118. In one or more embodiments, at least one slit 32 may extend through the thickness 28 of the electrically conductive substrate 24. In one or more embodiments, the at least one slit 32 may be positioned in a parallel or perpendicular orientation with respect to either the length 40 or width 42 of the electrically conductive substrate 24. In addition, the at least one slit 32 may be oriented at a slit angle with respect to the length 40 or width 42 of the electrically conductive substrate 24. In one or more embodiments, the length 116 of the at least one slit 32 may extend from about 10 mm to about 50 mm and the width 118 of the at least one slit 32 may range from about 1 mm to about 5 mm. FIG. 11 illustrates two slits 32 in a perpendicular orientation with respect to the substrate width 42. FIG. 12 shows three slits 32 that are in a parallel orientation with respect to the substrate width 42. In one or more embodiments, at least one slit 32 extends through the thickness 28 of the electrically conductive substrate 24 and traverses through the thickness 28 from a proximal slit end 116 at a point 122 that resides within the substrate perimeter 44 to a distal slit end 124 that resides at the substrate edge 46. In one or more embodiments, the distal end 124 of the at least one slit 32 may extend proximal of the edge 46, as illustrated in FIGS. 11 and 12 or may extend to the edge 46. In addition, the distal end 124 of the at least one slit 32 may extend through the edge 46 of the substrate 24 as shown in FIG. 13.

The primary objective of the at least one slit 32 is to prevent the formation of an eddy current loop on the surface of the electrically conductive substrate 24. Preventing the formation of the eddy current loop on the surface of the electrically conductive substrate 24 prevents the formation of the eddy current secondary magnetic field 18 which opposes the incident magnetic field 14 from the transmitting antenna 10 which disrupts the wireless transmission of the electrical energy via NFMC. In one or more embodiments, the at least one slit 32 extends through the edge 46 of the electrically conductive substrate 24 and "cuts" the eddy current loop, thereby preventing formation of the eddy current secondary magnetic field 18 in opposition to the incident magnetic field 14.

Figure 14:
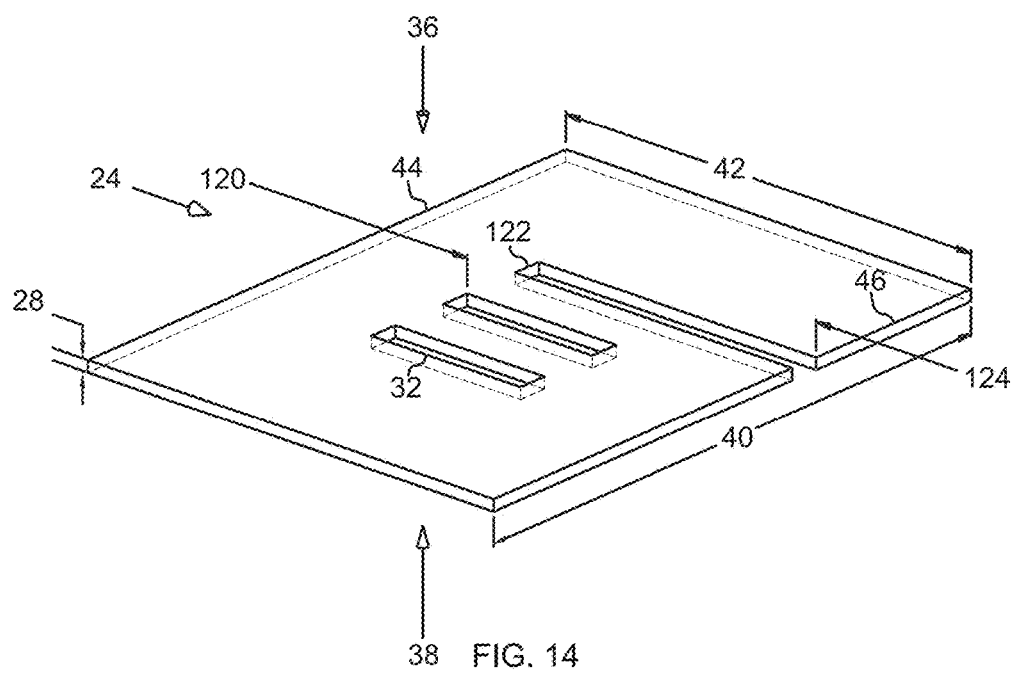

FIG. 13 shows a slit 32 oriented in a perpendicular orientation with respect to the substrate width 42 that extends through the edge 46 defined by the perimeter 44 of the substrate 24. FIG. 14 illustrates three spaced apart slits 32 that are arranged in a parallel orientation with respect to the substrate width 42. As shown, two of the slits 32 reside within the perimeter 44 of the substrate 24 whereas one of the slits 32 extends through the substrate edge 46.

Figure 15:
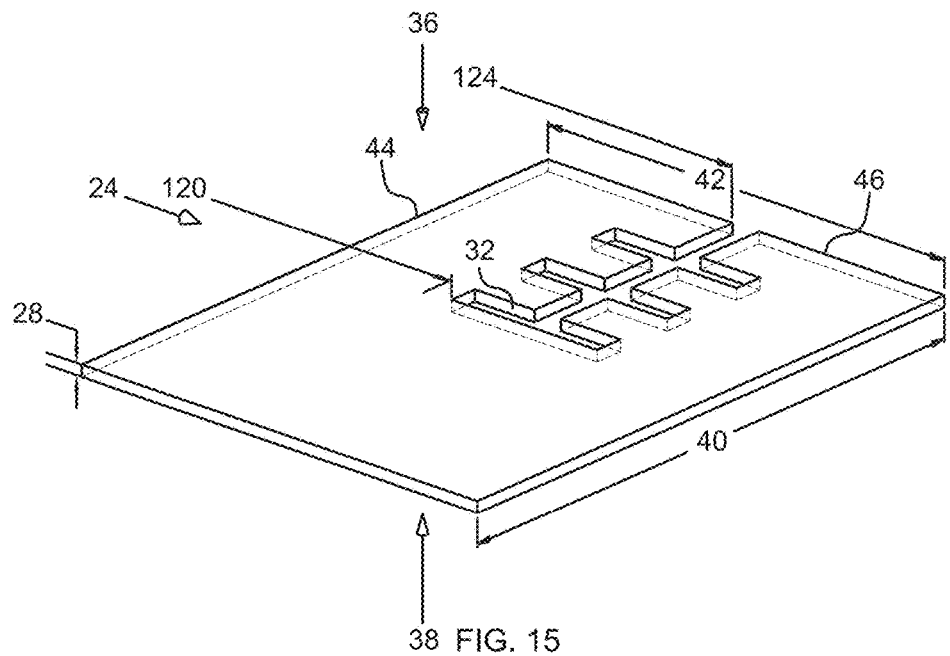
Figure 16:
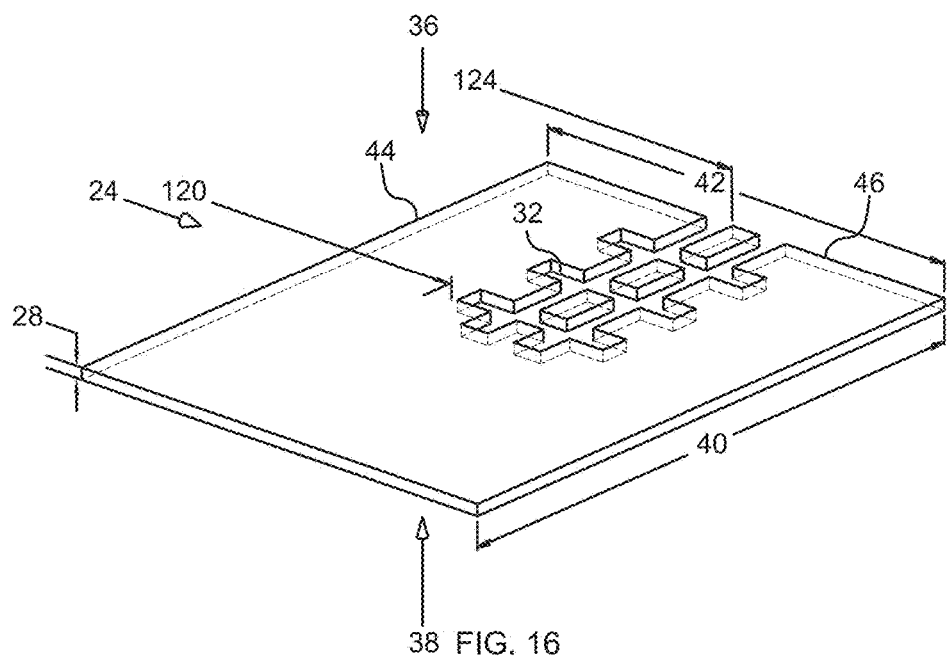

FIGS. 15 and 16 illustrate one or more embodiments in which a plurality of slits 32 may be arranged in a crisscross pattern. As illustrated in FIG. 15, three spaced apart slits 32 are positioned in a parallel orientation with respect to the substrate width 42. A fourth slit 32 positioned in a perpendicular orientation with respect to the substrate width 42 extends through the edge 46 of the substrate 24 and intersects the three spaced apart parallel oriented slits 32. As illustrated in FIG. 16, three spaced apart slits 32 are positioned in a parallel orientation with respect to the substrate width 42 and are arranged parallel to each other. Spaced apart fourth and fifth slits 32 positioned in a perpendicular orientation with respect to the substrate width 42, each extends through the edge 46 of the substrate and intersect the three spaced apart parallel slits 32. It is noted that each of the intersections of the parallel and perpendicular oriented slits 32 creates a cut-out portion 30 through the electrically conductive substrate 24.

Figure 17:
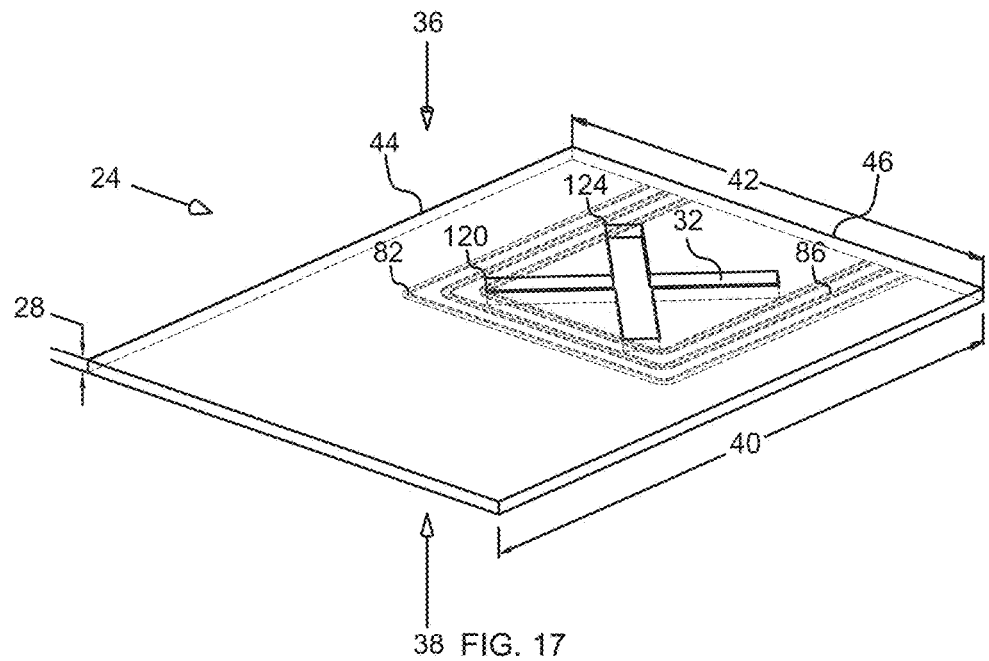
Figure 18:
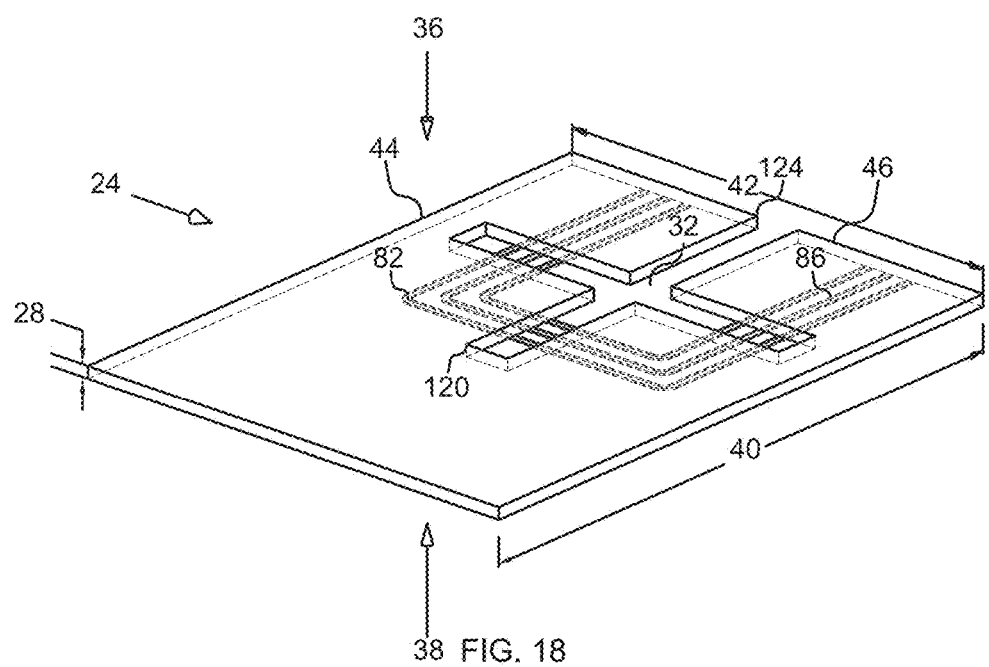

FIGS. 17 and 18 illustrate one or more embodiments in which two slits 32 are arranged such that they intersect within the perimeter of the substrate 24. As shown in FIG. 17, the two slits 32 are arranged similar to that of the letter "X". FIG. 18 illustrates a perpendicularly oriented slit 32 that intersects a parallel oriented slit 32 with respect to the substrate width 42. In one or more embodiments, the slit or slits 32 may be designed and oriented parallel to at least one trace 82 of a coil 54, 20 of the receiving or transmitting antenna 12, 10. In one or more embodiments, the at least one slit 32 may be oriented such that it extends towards or extends past at least one inductor coil trace 82 of the receiving coil 54 or transmitting coil 20 when the substrate 24 is oriented parallel to the respective inductor coil 20, 54. As illustrated in FIG. 17, the respective ends of the at least one slit 32 extend such that they are oriented parallel to the inductor coil trace 82 of an outer inductor coil 86 of a receiving antenna 12. As shown in FIG. 18, the respective ends of the at least one slit 32 extend past the inductor coil trace 82 of an outer inductor coil 86 of a receiving antenna 12 positioned parallel to the substrate 24.

Figure 19:
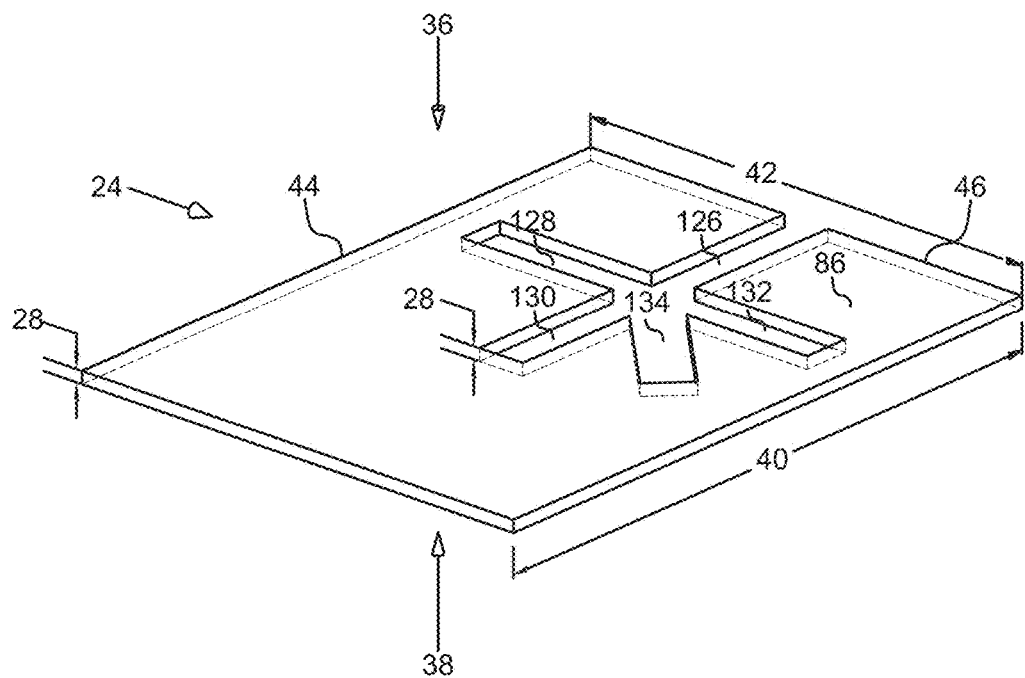

FIG. 19 illustrates a slit pattern comprising five slits 32 that extend from a central point. As shown, a first slit 126, a second slit 128, a third slit 130, and a fourth slit 132 are oriented at about a 90° angle from an adjacent slit. As illustrated, the first and second slit 126, 128, the second and third slit 128, 130, the third and fourth slit 130, 132 and the first and fourth slit 126, 132 are oriented about perpendicular to each other. A fifth slit 134 is positioned at about a 45° angle between the third and fourth slits 130, 132. In one or more embodiments, the fifth slit 134 may also be positioned at about a 45° angle between the first and second slits 126, 128 the second and third slits 128, 130 or the first and fourth slit 126, 132.

Figure 20:
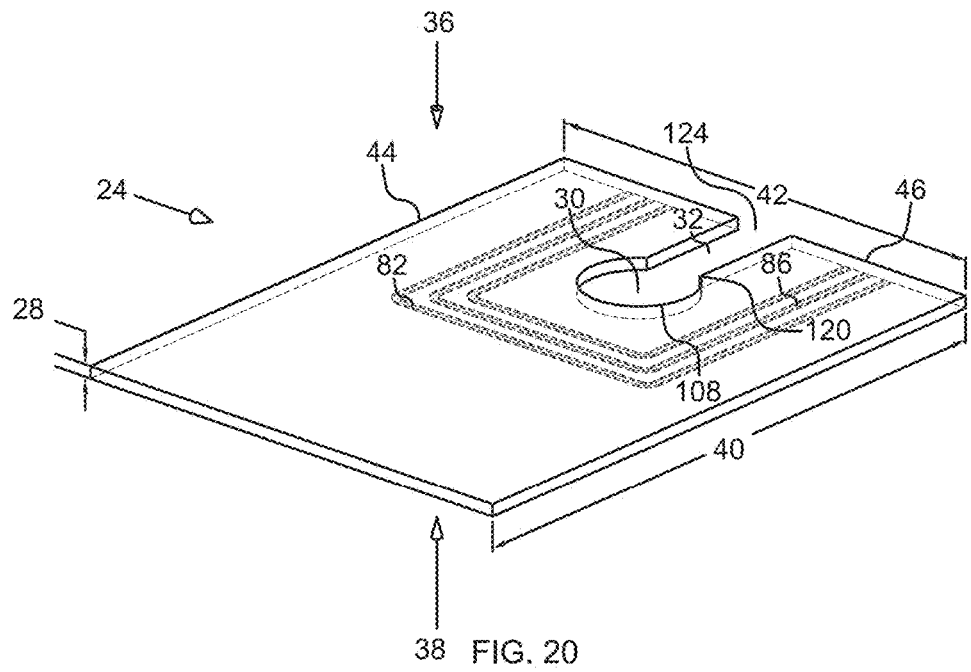
FIGS. 20-24 illustrate embodiments of various non-limiting combinations of cut-out and slit configurations.
Figure 21:
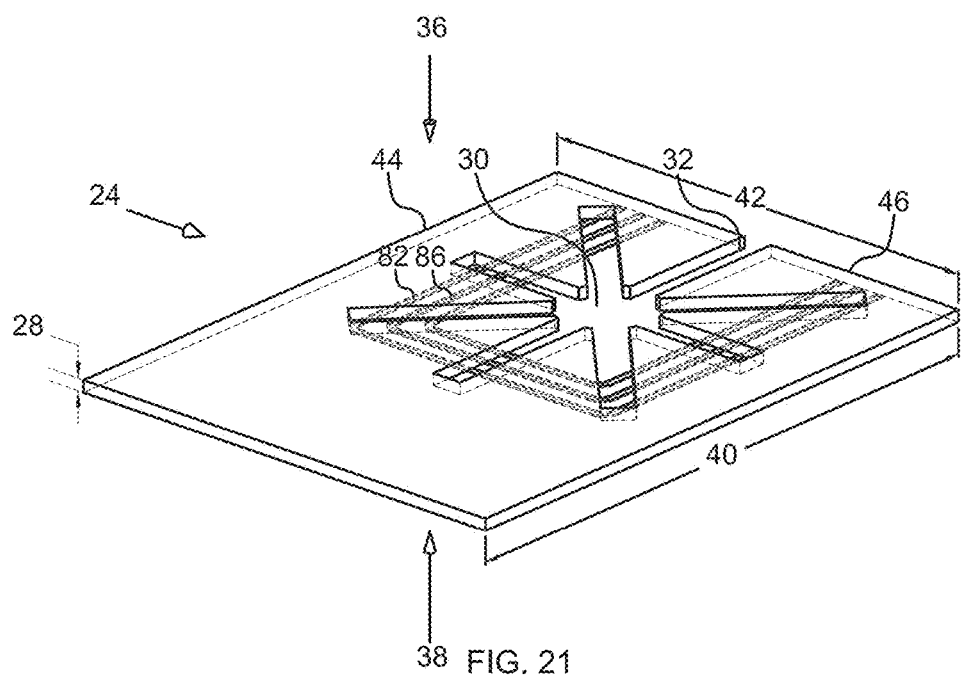
Figure 22:
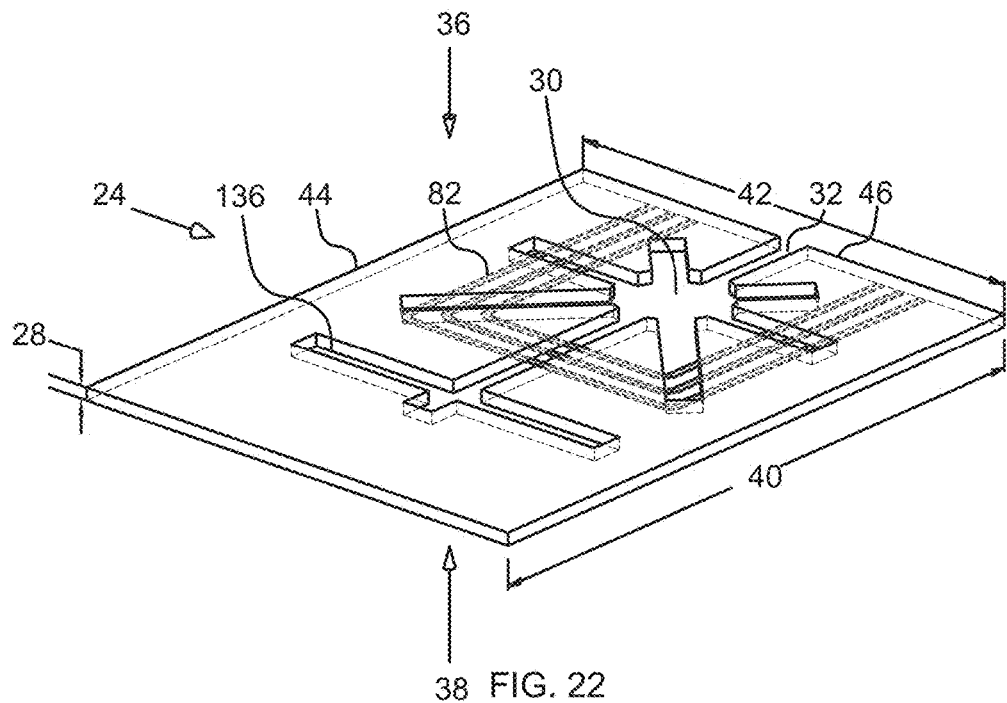
Figure 23:
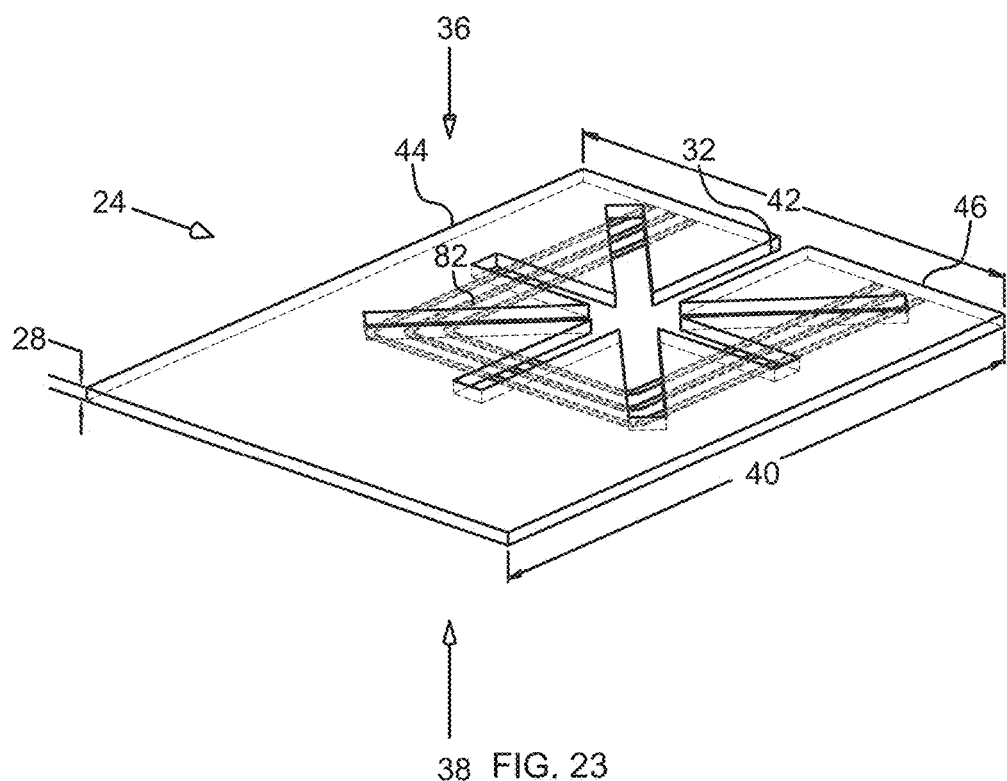
Figure 24:
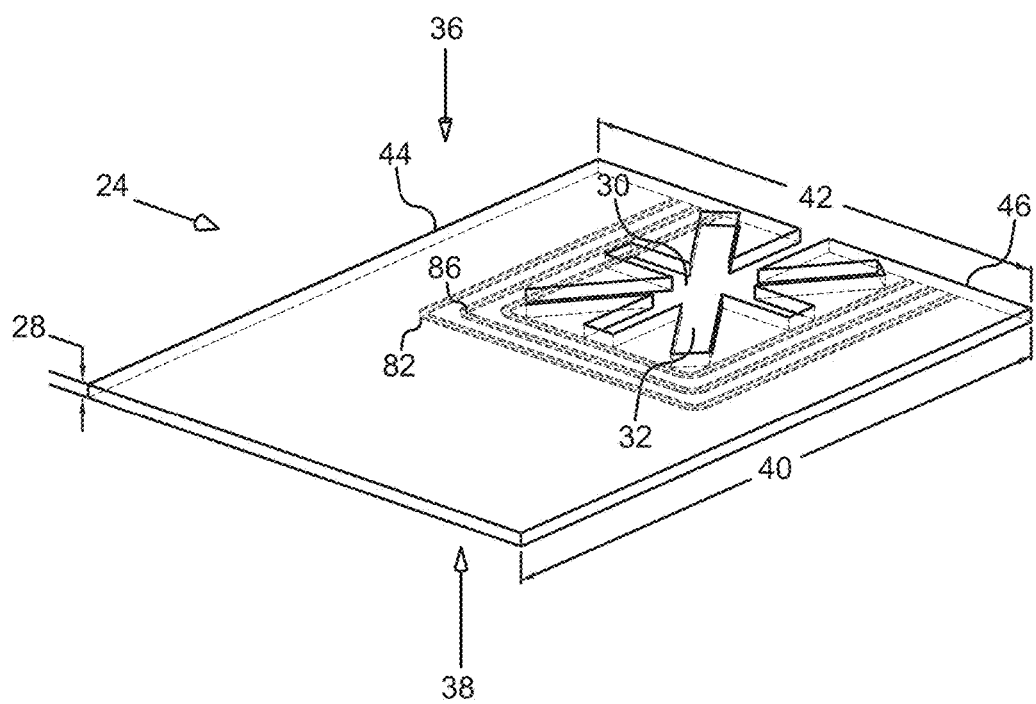

In addition to designing the electrically conductive substrate 24 with either a cut-out 30 or a slit 32, the metallic substrate 24 may be designed with a combination of at least one cut-out 30 and at least one slit 32. FIGS. 20 through 24 illustrate various embodiments of cut-out and slit patterns that may be comprised within the electrically conductive substrate 24. FIG. 20 illustrates a slit 32 that extends from a cut-out 30 configured in a circular geometric shape. As shown, the proximal end 120 of the slit 32 extends from the perimeter 108 of the cut-out 30 through the substrate edge 46. FIG. 21 illustrates a plurality of slits 32 that radially extend from a cut-out 30 configured having a circular geometric shape. As shown, eight slits 32 radially extend from the cut-out 30. As further shown, the proximal ends 120 of the eight slits 32 radially extend from the perimeter 108 of the cutout 30. FIG. 22 shows eight slits 32 that radially extend from a cut-out 30 configured in a circular geometry. A ninth slit 136 extends horizontally across one of the eight slits 32 that is oriented perpendicular. FIG. 23 shows eight slits 32 that radially extend from a cut-out 30 configured in a polygon geometry. As shown, the distal end 124 of four of the eight slits 32 extends towards the inductor coil trace 82 whereas the distal end 124 of three slits 32 extends past the inductor coil trace 82 of an adjacently positioned receiving or transmitting coil 54, 20. FIG. 24 shows eight slits 32 that radially extend from a cut-out 30 configured in a polygon geometry. As shown, all of the eight slits 32 extend toward the inductor coil trace 82 positioned parallel to the substrate 24 and do not extend past the inductor coil trace 82. In one or more embodiments, the width 118 of the at least one slit 32 is less than the diameter of the cut-out 30.

In either case, in one or more embodiments, the electrically conductive substrate 24 may be configured to have an "area" that is 80 percent or greater. As defined herein, "area" is the remaining surface area, in percent, of the metallic substrate 24 after the substrate 24 has been configured with the cut-out and/or slit pattern. "Area" is calculated by subtracting the percent surface area of the cut-out and/or slit pattern from the total surface area of the metallic substrate 24. For example, if a cut-out pattern comprises 10 percent of the total surface area of the metallic substrate 24 then the "area" is 90 percent (100% of the metallic surface area–10% of the surface area of the cut-out configuration). In one or more embodiments, an area that is 80 percent or greater mitigates the eddy current magnetic field by reducing the flux of the eddy current magnetic field in the cut-out/slit area. Also, an area that is 80 percent or greater increases the magnetic flux of the incident magnetic field 14 emanating from the transmitting antenna 10 in the cut-out area of the electrically conductive substrate 24 positioned in parallel to the coil 54 of the receiving antenna 12, thereby increasing mutual inductance between the transmitting and receiving antennas 10, 12.

In one or more embodiments, various electrical performance parameters were measured in which the electrically conductive substrate 24, comprising various cut-out and slit patterns, were incorporated with a receiving antenna 12. One electrical parameter is quality factor (Q) defined below. The quality factor of a coil defined as:

$$Q = \frac{\omega * L}{R}$$

Where:
- Q is the quality factor of the coil
- L is the inductance of the coil
- ω is the operating frequency of the coil in radians/s. Alternatively, the operating frequency (Hz) may be ω divided by 2π
- R is the equivalent series resistance at the operating frequency Another performance parameter is resistance of receiver antenna efficiency (RCE) which is coil to coil efficiency. RCE is defined as:

$$RCE = \frac{k^2 * Q_{Rx} * Q_{Tx}}{\left(1 + \sqrt{(1 + k^2 * Q_{rx} * Q_{tx})}\right)^2}$$

Where:
- RCE is the coil to coil efficiency of the system
- k is the coupling of the system
- $Q_{rx}$ is the quality factor of the receiver
- $Q_{tx}$ is the quality factor of the transmitter Another performance parameter is mutual induction (M). "M" is the mutual inductance between two opposing inductor coils of a transmitting and receiving antenna, respectively. Mutual induction (M) is defined as:

$$M = \frac{V_{induced}}{j * \omega * I_{Tx}}$$

Where:
- $V_{induced}$ is induced voltage on the receiver coil
- $I_{tx}$ is the AC current flowing through the transmitter coil
- ω is the operating frequency multiplied by 2π

Mutual inductance can be calculated by the following relationship:

$$M = k * \sqrt{L_{Tx} * L_{Rx}}$$

Where:
- M is the mutual inductance of the system
- k is the coupling of the system
- $L_{Tx}$ is the inductance of the transmitter coil
- $L_{Rx}$ is the inductance of the receiver coil Another performance parameter is figure of merit (FOM). "FOM" is a quotient that indicates the efficiency of wireless electrical energy between two opposing inductor coils of a transmitting and receiving antenna, respectively. Figure of Merit (FOM) is defined as:

$$FOM = k^2 Q_{rx} Q_{tx}$$

Where:
- k is the coupling of the system
- $Q_{rx}$ is the quality factor of the receiving antenna
- $Q_{tx}$ is the quality factor of the transmitting antenna The parameter of "effective area" is defined as the ratio of the area of the inductor coil that is not covered by the electrically conductive substrate comprising the at least one cut-out and slit. "Effective area" is defined as:

$$EFF\ AREA = \frac{\text{Area of Resonator Coil Not Covered By Substrate}}{\text{Area Of Resonator Coil}}$$

The parameter of "Area" is defined as the ratio of the combined surface area of the at least one cutout and slit within the electrically conductive substrate to the surface area of the electrically conductive substrate without the at least one cutout and slit. "Area" is defined as:

$$AREA = \frac{A-1}{B-1}$$

Where:
A is the combined surface area of the at least one cut-out and slit within an electrically conductive substrate
B is the surface area of the electrically conductive substrate without the at least one cut-out and slit formed within the substrate.

TABLE I

| Configuration No. | Configuration Description | Cut-out/Slit FIG. | L (µH) | ESR (Ω) | Q |
|---|---|---|---|---|---|
| 1 | Coil Only | N/A | 2.58 | 0.71 | 155.68 |
| 2 | Coil + Ferrite | N/A | 4.22 | 1.39 | 129.33 |
| 3 | Coil + Ferrite + Copper Backing | N/A | 4.01 | 1.47 | 116.21 |
| 4 | Ferrite + Copper Backing + Metal Cover | N/A | 0.92 | 1.00 | 39.19 |
| 5 | Ferrite + Copper Backing + Metal Cover with Circular Hole | 7 | 0.95 | 1.02 | 39 |
| 6 | Ferrite + Copper Backing + Metal Cover with Circular Hole and rectangular slit | 20 | 3.03 | 1.31 | 98.53 |
| 7 | Ferrite + Copper Backing + Metal Cover with Circular Hole and star slit | 21 | 2.70 | 1.41 | 81.57 |

Table I above details various measured performance parameters of an NFMC system comprising a transmitting antenna 10 and a receiving antenna 12. A transmitting antenna 10 comprising an NC3-A Airfuel certified resonant transmitting inductor coil 20 was used in the performance testing as detailed in configurations 1-7 shown in Table I. The transmitting antenna 10 was configured having a solenoidal inductor coil with a length of 170 mm and a width of 105 mm and 6 turns. The receiving antenna 12 comprised a receiving inductor coil 54 having 8 number of turns. The receiving inductor coil 54 was configured having a diameter of 34 mm. Test configuration 1 comprised only the receiving antenna 12 with the receiving coil 54. Test configuration 2 comprised the receiving antenna 12 with the receiving coil 54 positioned on Kitagawa FFSX ferrite material having a loss tangent of 110 and a thickness of 0.3 mm that served as a magnetic field shield. In test configuration 3, the receiving antenna 12 comprised a copper substrate having a thickness of 0.055 mm positioned in contact with the side of the ferrite material opposite the side that supported the receiving inductor coil 54 used in test configuration 2. Test configuration 4 comprised the receiving antenna 12 of test configuration 3 with the addition of an electrically conductive substrate 24 composed of copper with a thickness of 0.5 mm positioned proximal and parallel to the receiving coil 54. It is noted that the electrically conductive substrate 24 in test configuration 4, did not comprise an opening through its thickness. A gap of 0.01 mm separated the electrically conductive substrate 24 from the receiving coil 54. The electrically conductive substrate 24 simulated a metal cover of an electronic device such as a cellular phone. Test configuration 5 comprised the previous test configuration 4 with the addition of the electrically conductive substrate 24 having a circular cut-out 30 with a diameter of 21 mm extending through its thickness as illustrated in FIG. 7. The planar surface of the electrically conductive substrate 24 comprising the circular cut-out 30 was positioned proximal to and parallel to the receiving coil 54. The diameter or perimeter 108 of the cut-out 30 was of the same size and dimension as the inner diameter of the receiving coil 54. In addition, the electrically conductive substrate 24 comprising the circular cut-out 30 was oriented parallel to the receiving coil 54 such that an imaginary line oriented perpendicular therebetween was tangent to the perimeter 108 of the cut-out 30 and tangent to the inner diameter of the receiving coil 54. Test configuration 6 comprised the receiving antenna 12 as configured in test configuration 5 with the addition of a slit 32 that extended through the thickness of the electrically conductive substrate 24 from the perimeter 108 of the circular cut-out 30 through the side edge 46 of the electrically conductive substrate 24 as illustrated in FIG. 20. The slit 32 was configured with a width of about 3 mm and a length of about 12 mm. Test configuration 7 comprised the receiving antenna 12 as configured in test configuration 4 with the electrically conductive substrate 24 further comprising a cut-out pattern in the shape of a star, as illustrated in FIG. 21, formed through its thickness. The star cut-out pattern comprised eight slits 32 each having a width of about 3 mm radially extending from a circular hole having a diameter of 21 mm. One of the slits 32 extended through the side edge 46 of the electrically conductive substrate 24.

It is noted that the inductance values detailed in Table I were measured inductance values of the receiving antenna in free space measured with an Agilent 4294 A precision impedance analyzer at an operating frequency of 6.78 MHz. The equivalent series resistance (ESR) values in Table I list the measured ESR values of the receiving antenna in free space measured with an Agilent 4294 A precision impedance analyzer at an operating frequency of 6.78 MHz. The quality factor values listed in Table I were of the receiving antenna 12 at an operating frequency of 6.78 MHz.

As shown in Table I above, positioning an electrically conductive substrate 24, such as a metal cover, in front of the receiving coil 54 of the receiving antenna 12, as tested in configuration 4, significantly reduced the inductance and quality factor. In addition, equivalent series resistance (ESR) increased in comparison to test configuration 1 comprising only the receiving antenna 12. This increase in ESR and reduction in inductance and quality factor is the result of the formation of the opposing secondary magnetic field 18 created by the eddy current on the surface of the electrically conductive substrate 24 as previously discussed.

metallic substrate 24 configured with the cutout and/or slit pattern was positioned proximal and oriented in parallel to the inductor receiving coil 54. In addition, configurations of Test Nos. 3-16 comprising a metallic substrate 24 having a cut-out 30, the perimeter 108 of the cut-out 30 was positioned in alignment with the inner diameter of the inner receiving inductor coil 84 of the receiving antenna 12.

TABLE II

| Test No. | FIG. No. | L (µH) | R (mΩ) | Q | K (%) | FOM | M (nH) | RCE (%) | Eff Area (%) | Area (%) |
|---|---|---|---|---|---|---|---|---|---|---|
| 1 | Outer Coil | 0.72 | 460 | 66 | 7.7 | 95.99 | 220 | 78 | N/A | N/A |
| 2 | Inner and Outer Coil | 6.01 | 3420 | 74 | 6.0 | 66.1 | 500 | 73 | N/A | N/A |
| 3 | 12 | 0.94 | 834 | 47 | 2.6 | 7.8 | 85 | 31.3 | 12.3 | 94.6 |
| 4 | 15 | 1.20 | 858 | 59.2 | 7.1 | 73.8 | 264 | 74.5 | 17.1 | 92.3 |
| 5 | 16 | 1.25 | 916 | 58.4 | 7.3 | 76.4 | 276 | 75.9 | 21.9 | 89.1 |
| 6 | 17 | 0.68 | 767 | 37.4 | 1.3 | 1.4 | 35 | 10 | 9.2 | 96.0 |
| 7 | 18 | 1.00 | 764 | 55 | 6.4 | 56.1 | 218 | 72 | 9.3 | 96.0 |
| 8 | 20 | 0.93 | 700 | 56.5 | 5.6 | 43.2 | 182 | 68.3 | 6.1 | — |
| 9 | 20 | 1.65 | 783 | 90 | 11.5 | 292.8 | 500 | 89.1 | 100 | 79.4 |
| 10 | 21 | 1.17 | 866 | 58.7 | 7.7 | 85.7 | 282 | 77 | 21.4 | 91.5 |
| 11 | 21 | 1.3 | 903 | 61 | 8.2 | 100.0 | 315 | 83 | 46.9 | — |
| 12 | 22 | 1.24 | 893 | 59 | 6.6 | 63.9 | 250 | 74 | 46.9 | >80 |
| 13 | 23 | 1.16 | 862 | 57.2 | 7.5 | 78.3 | 272 | 75.8 | 19.3 | 92.2 |
| 14 | 23 | 1.44 | 895 | 68.6 | 9.8 | 161.2 | 397 | 86.3 | 32.8 | 93.4 |
| 15 | 23 | 1.35 | 903 | 63 | 8.9 | 122.7 | 350 | 84.9 | 25.8 | 94.8 |
| 16 | 24 | 1.15 | 832 | 58.8 | 8.4 | 102.1 | 305 | 78.6 | 16.9 | 93.8 |

Table II above details the measured performance parameters of a near field magnetic coupling (NFMC) system comprising a transmitting antenna 10 and a receiving antenna 12. In one or more embodiments, a metallic substrate 24 configured with various cut-out and slit patterns, as detailed in Table II above was positioned in parallel with a receiving antenna coil 54 such that the substrate 24 was positioned between the receiving coil 54 of the receiving antenna 12 and the transmitting antenna 10.

In one or more embodiments, the transmitting antenna 10 for all test Nos. 1-16, comprised an NC3-A Airfuel certified resonant transmitting coil. The transmitting antenna 10 was configured having a solenoidal inductor coil with a length of 170 mm and a width of 105 mm and 6 turns. It is noted that the "outer coil" configuration, test No. 1, detailed in Table II above, comprised only a receiving antenna 12 having a receiving coil 54 with a length of 73 mm, a width of 55 mm and 5 turns. The "inner and outer coil" configuration, test No. 2, detailed in Table II above comprised a receiving antenna 12 with only an outer coil having a length of 73 mm, a width of 55 mm and 5 turns and an inner coil electrically connected in series to the outer coil. The inner coil was configured having a diameter of 34 mm and 10 turns. Test Nos. 3-8 comprised a receiving antenna 12 configured with an outer coil having a length of 73 mm, a width of 55 mm and 5 turns. Test Nos. 9-16 comprised a receiving antenna 12 configured with an outer coil having a length of 73 mm, a width of 55 mm with 5 turns and an inner coil electrically connected in series to the outer coil. The inner coil was configured having a diameter of 66 mm and 5 turns. The receiving antenna 12 of Test Nos. 3-16 also comprised a copper backing substrate and Kitagawa Industries' FFSX ferrite material having a loss tangent of about 110 that served as a magnetic field shield. The ferrite material served as the substrate on which the receiving coil 54 was positioned. The copper backing substrate was positioned in contact with the ferrite material opposite the side supporting the receiving inductor coil 54. The ferrite material had a thickness of 0.35 mm, and the copper backing substrate had a thickness of 0.055 mm.

A copper substrate 24 having a thickness of about 0.5 mm configured with various cut-out and slit patterns correlating to the figure number, shown in Table II was positioned proximal to the receiving coil 54. More specifically, the It is noted that the inductance values detailed in Table II were the measured inductance values of the receiving antenna 12 in free space at an operating frequency of 6.78 MHz. The equivalent series resistance (ESR) values detailed in Table II were the measured ESR values of the receiving antenna 12 in free space at an operating frequency of 6.78 MHz. The quality factor values listed in Table II were of the receiving antenna at an operating frequency of 6.78 MHz. The inductance and ESR values were measured with an Agilent 4294A precision impedance analyzer. It is also noted that the symbol "—" indicates that a measurement was not taken.

As detailed in Table II, utilization of the metallic substrate 24 configured with the cut-out and slit pattern shown in FIG. 20 exhibited the greatest mutual inductance, FOM, and RCE. This increased performance is attributed to the combination of the cut-out and slit pattern illustrated in FIG. 20. Specifically, the perimeter 108 of the cut-out 30 is dimensioned in a circular shape and aligned with the inner diameter of the interior coil 84 of the receiving antenna 12. In addition, the slit 32 radiating from the perimeter 108 of the cut-out 30 and extending through the edge 46 of the substrate 24 is attributed to have disrupted the eddy current and thus minimized the magnitude of the opposing secondary magnetic fields.

TABLE III

| Gap Distance (mm) | RCE (%) |
|---|---|
| 1.0 | 87 |
| 0.5 | 89 |
| 0.0 | 92 |

Table III above illustrates how the size of the gap 56 between the electrically conductive substrate 24, comprising the at least one cut-out 30 and slit 32, and the inductor coil 54 of the receiving antenna 12 affects RCE between the transmitting and receiving antennas 10, 12. In one or more embodiments, the transmitting antenna 10 comprised an NC3-A Airfuel certified resonant transmitting coil. The transmitting antenna 10 was configured having a solenoidal inductor coil with a length of 170 mm and a width of 105 mm and 6 turns. The receiving coil 54 was configured having a coil with a diameter of 34 mm with 8 turns.

The receiving antenna 12 also comprised a copper backing substrate and FFSX-3 ferrite material having a loss tangent of 110 that served both as the substrate supporting the receiving coil 54 and magnetic field shield. The copper substrate was positioned in contact with the side of the ferrite material opposite the side supporting the receiving coil configuration. The ferrite material had a thickness of 0.35 mm, and the copper backing substrate had a thickness of 0.055 mm. A plastic spacer 68 was positioned between the electrically conductive substrate 24 comprising the cutout/slit pattern, as illustrated in FIG. 19, and the receiving coil 54. Spacers 68 having different thicknesses were used to control the gap distance as detailed in Table III.

As indicated in Table III above, the RCE between the transmitting antenna 10 and the receiving antenna 12 increases as the gap 56 between the electrically conductive substrate 24 comprising the cut-out/slit pattern and the receiving antenna coil 54 decreases. As shown, the RCE increased from about 87 percent to about 92 percent as the gap 56 between the receiving coil 54 and metallic substrate 24 decreased from about 1 mm to about 0 mm.

Figure 25:
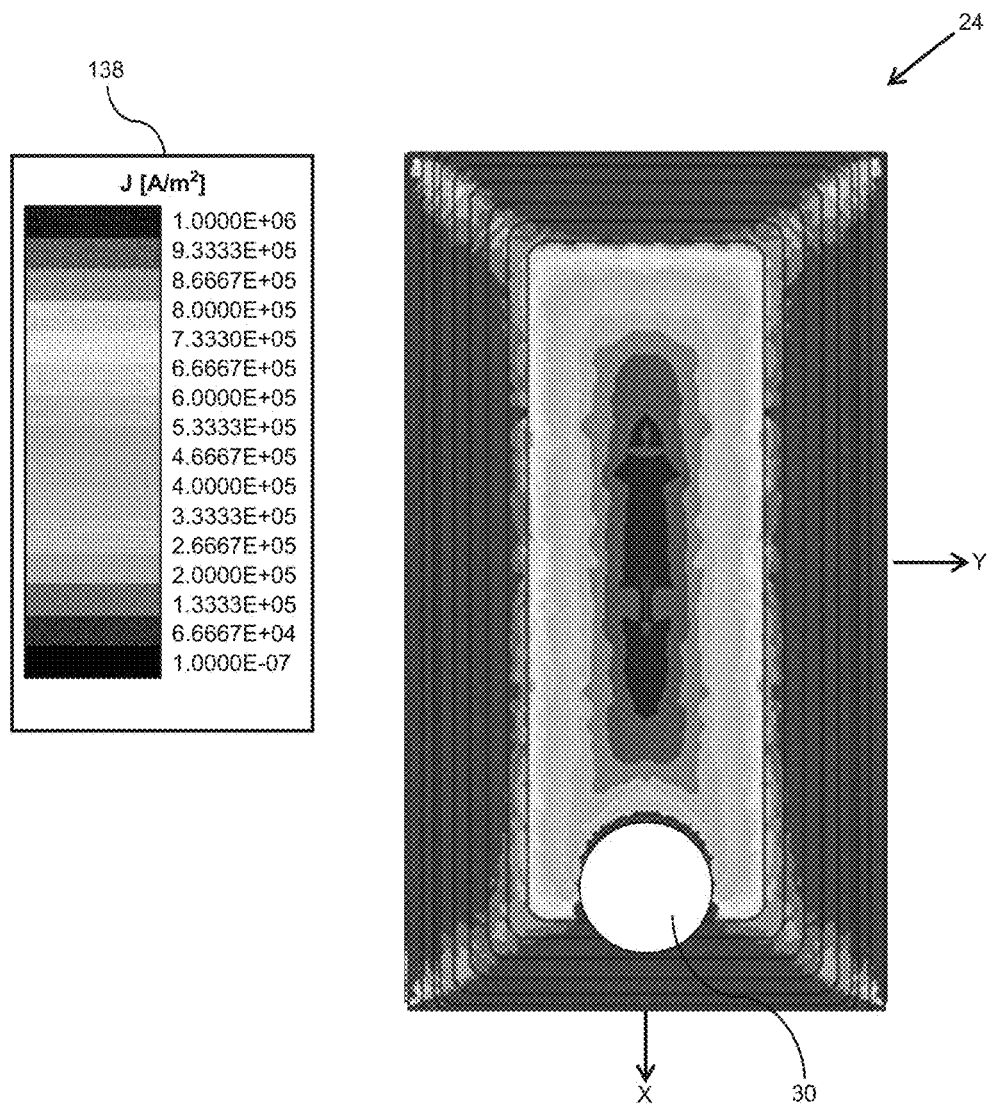
FIGS. 25-28 illustrate embodiments of model simulated eddy current densities and direction vectors using various cut-out and slit patterns of the present disclosure.
Figure 26:
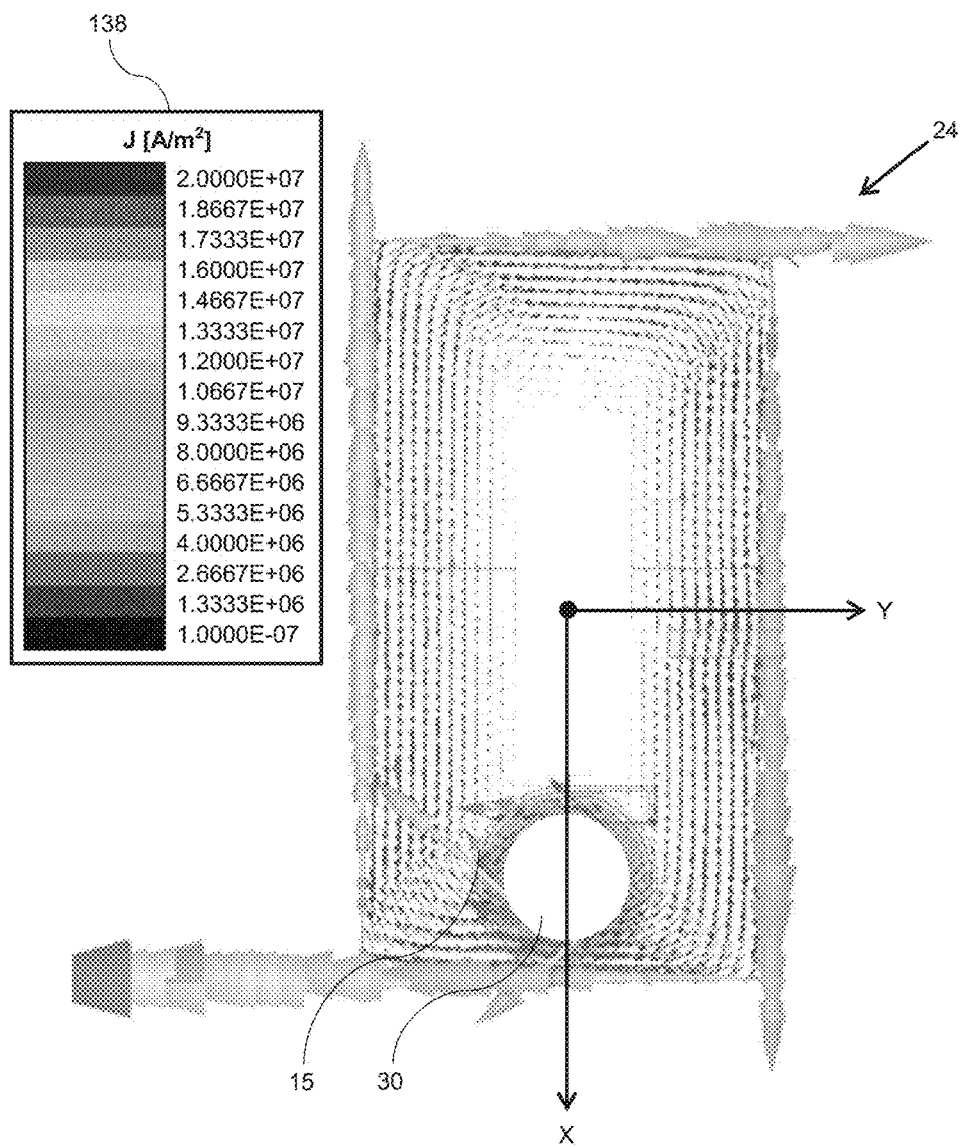

FIGS. 25 and 26 are plots that illustrate embodiments of the eddy current density (Joule Ampere/m$^2$) (FIG. 25) and eddy current density vector (FIG. 26) taken from a computer simulation of an embodiment of an electrically conductive substrate 24 comprising a circular cut-out 30. The legend 138 illustrates the relative intensity of the eddy current density along the surface of the simulated metallic substrate 24 in Joules Ampere/m$^2$. It is noted that the checkered pattern surrounding the simulated eddy current densities shown in FIGS. 25 through 28 is an artifact of the computer simulation.

FIG. 25 illustrates the simulation of the eddy current density (Joules Ampere/m$^2$) along the surface of an electrically conductive substrate 24 comprising a circular shaped cut-out 30. It is noted that the darkened intensity about the center of the plot, where the "x" and "y" co-ordinate arrows intersect, is an artifact of the computer simulation as the "z" co-ordinate, coming out of the plane of the plot, artificially creates a dark area about the center of the plot. As shown, the eddy current density (Joule Ampere/m$^2$) is strongest along the edge of the substrate 24. The eddy current density is weakest about the center of the plot, where the "x" and "y" co-ordinate arrows intersect. As further illustrated in the simulation, the eddy current density is zero within the circular cut-out 30. This, therefore, enables the incident magnetic field 14 emanating from the transmitting antenna 10 to pass therethrough. In addition, as shown in FIG. 26, the eddy current 15 flows in a clockwise direction about the circular shaped cut-out 30. It is noted that removing surface area from the electrically conductive substrate 24 that is not aligned with the receiving inductor coil 54, tends to increase the eddy current density on the surface areas of the substrate 24. This tends to increase the strength of the opposing eddy current secondary magnetic fields 18 that generally leads to a reduction in mutual inductance and coupling.

Figure 27:
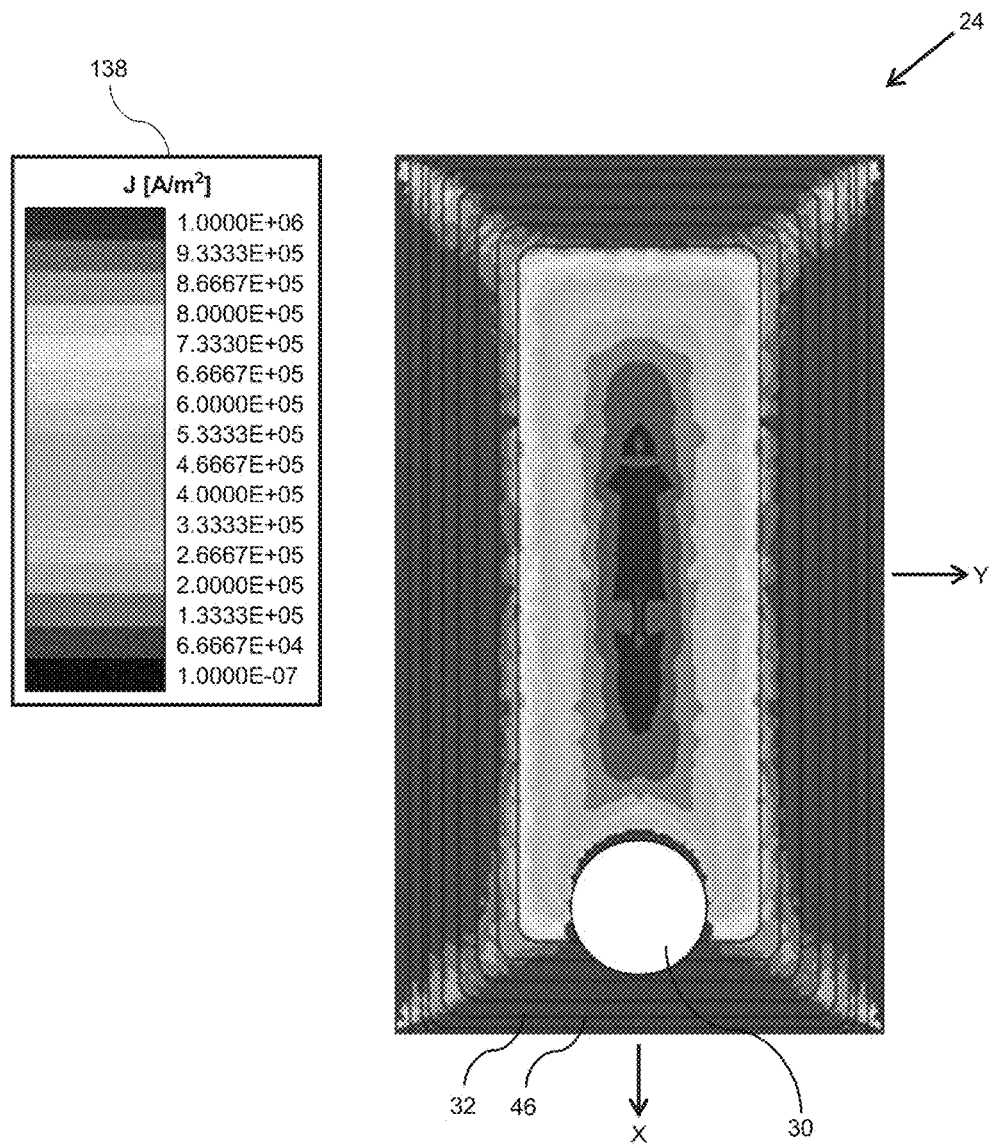
Figure 28:
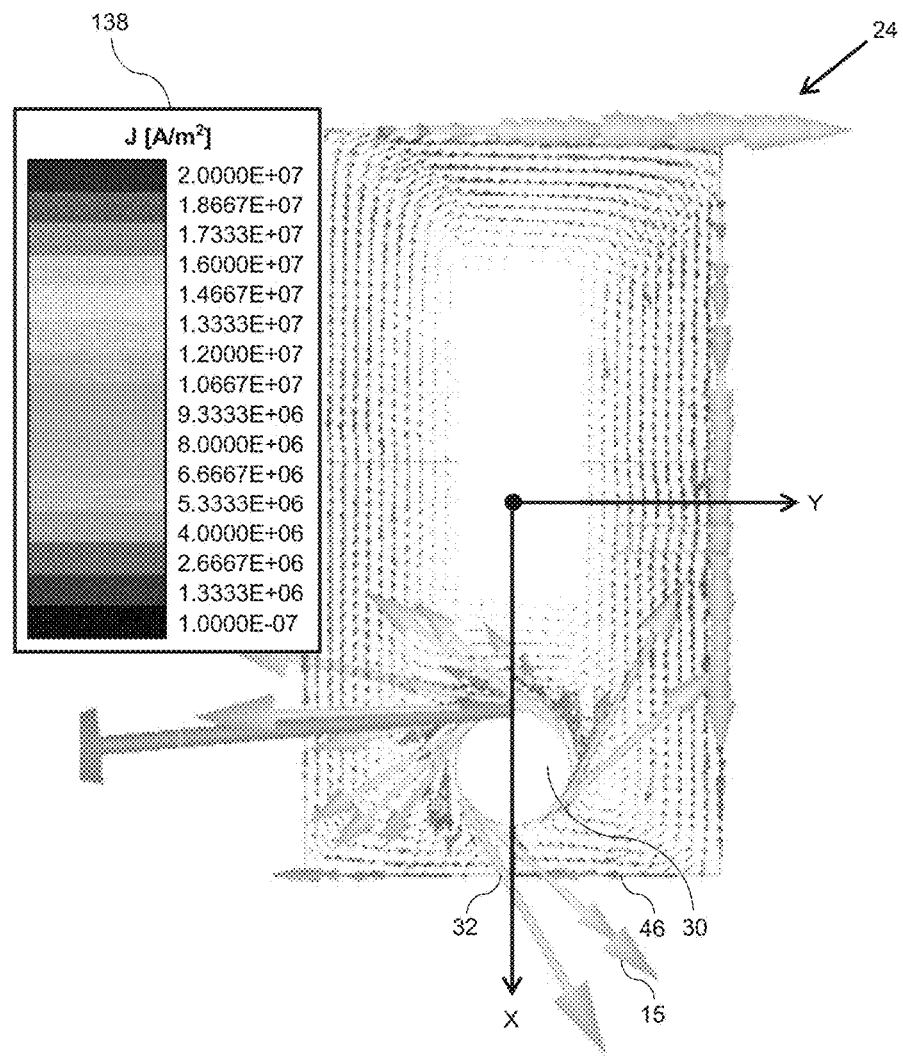

FIGS. 27 and 28 illustrate a further embodiment of the eddy current density (FIG. 27) and eddy current density vector (FIG. 28) taken from a computer simulation. In this embodiment, the simulated electrically conductive substrate 24 comprises a circular shaped cut-out 30 and a slit 32 that radially extends from the perimeter 108 of the circular shaped cut-out 30 through the substrate edge 46. In this embodiment, as shown in FIG. 28, the eddy current 15 is flowing in a counter-clockwise direction about the circular shaped cut-out 30.

FIG. 27 illustrates the simulation of the eddy current density (Joule Ampere/m$^2$) along the surface of an electrically conductive substrate 24 comprising the circular shaped cut-out 30 and the slit 32 that radially extends from the cut-out 30 and extends through the substrate edge 46. It is noted that the darkened intensity about the center of the plot, where the "x" and "y" co-ordinate arrows intersect, is an artifact of the computer simulation as a "z" co-ordinate, coming out of the plane of the plot, artificially creates a dark area about the center of the plot. As shown in the plot, the eddy current density is strongest along the perimeter 44 of the substrate 24. The eddy current density is weakest about the center of the plot, where the "x" and "y" co-ordinate arrows intersect. As further illustrated in the simulation, the eddy current density significantly decreases in a radial fashion from the cut-out perimeter 108 along the substrate surface 36. The significant decrease in eddy current density outwardly extending from the perimeter 108 of the cut-out 30 is attributed to the slit 32 that radially extends from the perimeter of the cut-out 30 extending through the edge 46 of the substrate 24. Similar to FIG. 25, the eddy current density within the cut-out 30 is zero. Therefore, as shown in the simulation, the eddy current does not flow within the cut-out 30 and therefore allows for the incident magnetic field 14 emanating from the transmitting antenna 10 to pass therethrough. Furthermore, configuring the electrically conductive substrate 24 having a circular shaped cut-out 30 and slit 32 extending through the substrate edge 46, as shown in FIGS. 27 and 28, significantly reduces the eddy current density in an outward radial direction from the cut-out 30. Thus, the strength of the eddy current is significantly reduced in the area surrounding the cut-out 30 which is aligned with the adjacent receiving inductor coil 54 of the receiving antenna 12 as previously discussed. Thus, interference caused by the eddy current 15 is reduced in the area that surrounds the cut-out 30. This, therefore, allows an increased magnitude of the incident magnetic field 14 from the transmitter antenna 10 to pass therethrough, which thus allows for an increase in wireless electrical energy through an electrically conductive substrate 24.

In addition, as illustrated in FIG. 28, due to the slit 32, the eddy current 15 around the cut-out 30 is now flowing in a counter-clockwise direction, i.e., in the same direction as the direction of the current from the transmitting antenna coil 20. Therefore, the magnitude of the incident magnetic field 14 around the cut-out region is not only "maintained," but is also increased. Since there is some increase in the magnitude of the incident magnetic field 14 due to the cut-out and slit pattern, it is understood that bringing the receiving antenna coil 54 closer to the electrically conductive substrate 24 comprising the cut-out and slit pattern, will also increase the coupling, mutual inductance and RCE of the NFMC antenna system. It is noted that these simulation results correlate to the experimental results shown in Table II in which a circular cut-out and slit pattern, shown in FIG. 20, also exhibited an increase in coupling, mutual inductance, and RCE.

Figure 29:
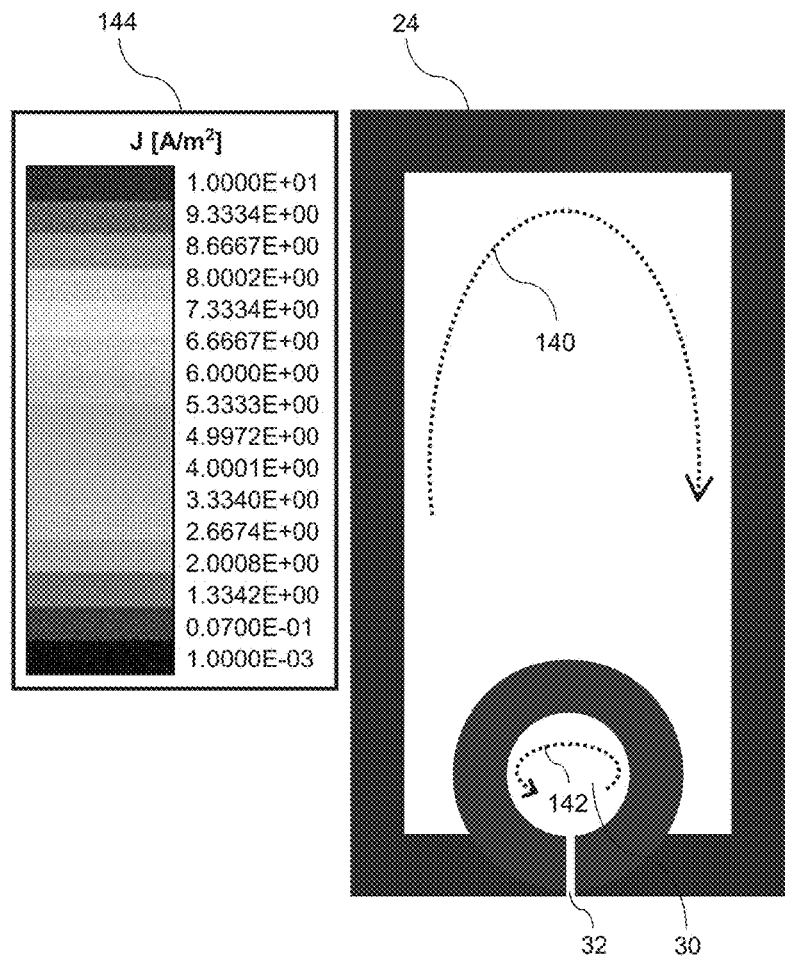
FIG. 29 illustrates an embodiment of a simulated model that shows the relative direction of the eddy current and electrical energy wirelessly transmitted from a transmitting antenna on the surface of an electrically conductive substrate comprising a cut-out and slit configuration.

FIG. 29 illustrates an embodiment of the path of the eddy current 15 taken from the computer simulation of the embodiment illustrated in FIGS. 27 and 28 simulating an electrically conductive substrate 24 comprising a circular shaped cut-out 30 and slit 32 that radially extends from the perimeter 108 of the circular shaped cut-out 30 through the substrate edge 46. In this embodiment, a simulated single loop inductor coil 54 was used as the receiving antenna 12. It is noted that this embodiment is a representation of the maximum intensity of the eddy current. As shown, the flow of the eddy current 15 along the surface of the substrate 24, represented by first loop 140, is clockwise, while the current flow of the eddy current about the cut-out 30, represented by second loop 142 is counter-clockwise due to the slit 32. Thus, the simulation illustrates that the slit 32 radially extending from the cut-out 30 and extending through the substrate edge 46 modifies the direction of the eddy current about the cut-out in a counter-clockwise direction, which is the same directional flow of the electrical energy wirelessly transmitted from a transmitting antenna 10. Therefore, since the direction of the eddy current 15 about the cut-out 30 and the electrical energy wirelessly transmitted from the transmitting antenna 10 are the same, i.e., counter-clockwise, the interaction of the incident magnetic field and the secondary magnetic field caused by the eddy current about the cut-out 30 is minimized. Thus, electrical energy wirelessly transmitted by NFMC from a transmitting antenna 10 efficiently passes through an electrically conductive material comprising the cut-out 30 and slit 32 configuration.

Figure 30:
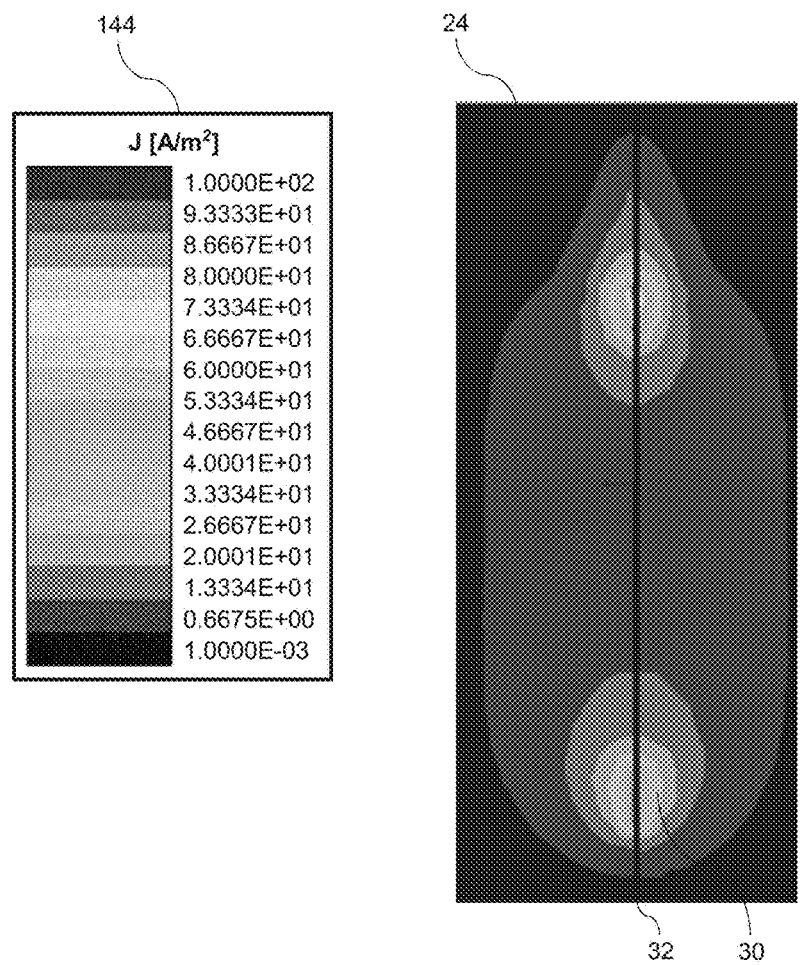
FIG. 30 shows an embodiment of the magnitude of the magnetic fields that emanate perpendicularly from the surface of the electrically conductive substrate illustrated in FIG. 29.

FIG. 30 illustrates an embodiment of the intensity of the magnetic field in Ampere per meter oriented perpendicular to the embodiment of FIG. 29. A legend 144 shows the intensity of the magnetic field perpendicular to the surface of the substrate 24. As shown in the simulation, the maximum intensity of the eddy current decreases a distance away from the substrate 24. However, the magnetic field, having a counter-clockwise rotation, is strong at the center of the circular shaped cut-out 30 and slit 32. Thus, as the simulation illustrates, the electrically conductive substrate configured with the cut-out 30 and slit 32 minimizes interaction of the incident magnetic field 14 with the secondary eddy current magnetic field 18. As a result, the magnitude of the incident magnetic field 14 through the cut-out 30 and slit 32 pattern is maximized and the efficiency of wireless transmission of electrical energy through the electrically conductive substrate 24 is increased.

Thus, it is contemplated that the electrically conductive substrate 24 of the present disclosure is capable of being configured having a variety of unlimited cut-out and/or slit patterns. Furthermore, such a configuration of the variety of unlimited cut-out and/or slit patterns allows for and significantly improves the wireless transmission of electrical energy through an electrically conductive material. It is further contemplated that the various magnetic shielding materials 34 can be strategically positioned adjacent to the antenna 10, 12 and the electrically conductive substrate 24 configured with the various cut-out and/or slit patterns to enhance quality factor and mutual inductance between adjacently positioned transmitting and receiving antennas 10, 12. It is appreciated that various modifications to the inventive concepts described herein may be apparent to those of ordinary skill in the art without departing from the spirit and scope of the present disclosure as defined by the appended claims.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more embodiments, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

Reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A substrate, comprising:
   a) a substrate surface extending to a perimeter having an end defining a substrate surface area and a substrate thickness oriented about perpendicular to the substrate surface;
   b) a cut-out residing within the substrate surface, the cut-out comprising a cut-out perimeter defining a cut-out shape oriented parallel to the substrate surface, the cut-out extending through the substrate thickness; and
   c) at least one slit having a slit length extending from a slit proximal end to a slit distal end, a slit width oriented perpendicular to the slit length, and a slit depth extending at least partially within the substrate thickness, wherein the slit proximal end extends from the cut-out perimeter, the slit distal end extending towards a substrate edge;
   d) wherein the cut-out and the at least one slit define a cut-out pattern surface area, and wherein a substrate is configured according to the equation:

$$\frac{A-1}{B-1} > 80 \text{ percent}$$

where A is the cut-out pattern surface area defined by the combined surface areas of the cut-out and the at least one slit and B is the surface area of the sidewall without the cut-out and the at least one slit within the sidewall.

2. The substrate of claim 1 wherein the slit depth extends through the substrate thickness.

3. The substrate of claim 1 wherein the slit proximal end resides at the substrate edge.

4. The substrate of claim 1 wherein the slit proximal end extends through the substrate edge.

5. The substrate of claim 1 wherein the cut-out shape is configured in a geometric shape selected from the group consisting of a circle, an oval, a rectangle, a square, a triangle, an octagon, and a polygon.

6. The substrate of claim 1 wherein the substrate is composed of an electrically conducting material.

7. The substrate of claim 1 wherein the width of the at least one slit ranges from 1 mm to about 5 mm.

8. The substrate of claim 1 wherein the length of the at least one slit ranges from 10 mm to about 50 mm.

9. The substrate of claim 1 wherein the substrate is positionable parallel to an inductor coil of a receiving antenna or a transmitting antenna.

10. The substrate of claim 9 wherein the cut-out and the inductor coil are aligned so that an imaginary line oriented perpendicular therebetween extends through a perimeter of the cut-out and an inner diameter of the inductor coil.

11. The substrate of claim 9 wherein the transmitting or receiving antenna is electrically incorporated with an electric device.

12. The substrate of claim 11 wherein the electronic device is selected from the group consisting of a cellular phone, a computer, a radio, a television, a medical device, and a device that comprises an electronic circuit.

13. The substrate of claim 9 wherein the inductor coil resides on a surface of a ferrite material.

14. The substrate of claim 13 wherein the ferrite material has a loss tangent equal to or less than about 0.70.

15. The substrate of claim 13 wherein an opening extends through a thickness of the ferrite material, the inductor coil positioned on the surface of the ferrite material surrounding the opening.

16. The substrate of claim 13 wherein the ferrite material comprises an overhang portion that circumferentially extends around an outer diameter of the inductor coil.

17. The substrate of claim 1 wherein the substrate comprises a sidewall of an electronic device.

18. The substrate of claim 17 wherein the electronic device is selected from the group consisting of a cellular phone, a computer, a radio, a television, a medical device, and a device that comprises an electronic circuit.

* * * * *